United States Patent
Youn et al.

(10) Patent No.: US 10,424,503 B2
(45) Date of Patent: *Sep. 24, 2019

(54) METHODS OF FABRICATING SEMICONDUCTOR DEVICES INCLUDING FIN-SHAPED ACTIVE REGIONS

(71) Applicant: Samsung Electronics Co., Ltd., Suwon-si, Gyeonggi-do (KR)

(72) Inventors: Young-sang Youn, Suwon-si (KR); Myung-geun Song, Yongin-si (KR); Ji-hoon Cha, Seoul (KR); Jae-jik Baek, Seongnam-si (KR); Bo-un Yoon, Seoul (KR); Jeong-nam Han, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/885,067

(22) Filed: Jan. 31, 2018

(65) Prior Publication Data

US 2018/0174889 A1     Jun. 21, 2018

Related U.S. Application Data

(63) Continuation of application No. 15/637,552, filed on Jun. 29, 2017, now Pat. No. 10,090,190, which is a
(Continued)

(30) Foreign Application Priority Data

Feb. 8, 2013   (KR) .................. 10-2013-0014656

(51) Int. Cl.
*H01L 21/762*     (2006.01)
*H01L 21/8234*    (2006.01)
(Continued)

(52) U.S. Cl.
CPC .... *H01L 21/76229* (2013.01); *H01L 21/2652* (2013.01); *H01L 21/763* (2013.01);
(Continued)

(58) Field of Classification Search
None
See application file for complete search history.

(56) References Cited

U.S. PATENT DOCUMENTS 6,617,251 B1   9/2003   Kamath et al.
7,476,933 B2   1/2009   Juengling
(Continued)

FOREIGN PATENT DOCUMENTS

JP     2011-009296       1/2011
KR   10-2006-0079329    7/2006
(Continued)

*Primary Examiner* — Herve-Louis Y Assouman
(74) *Attorney, Agent, or Firm* — Myers Bigel, P.A.

(57) ABSTRACT

A method of manufacturing a semiconductor device includes forming a plurality of fins by forming a plurality of first device isolating trenches repeated at a first pitch in a substrate, forming a plurality of fin-type active areas protruding from a top surface of a first device isolating layer by forming the first device isolating layer in the plurality of first device isolating trenches, forming a plurality of second device isolating trenches at a pitch different from the first pitch by etching a portion of the substrate and the first device isolating layer, and forming a second device isolating layer in the plurality of second device isolating trenches, so as to form a plurality of fin-type active area groups separated from each other with the second device isolating layer therebetween.

20 Claims, 29 Drawing Sheets

Related U.S. Application Data continuation of application No. 15/058,664, filed on Mar. 2, 2016, now Pat. No. 9,728,535, which is a continuation of application No. 14/175,212, filed on Feb. 7, 2014, now Pat. No. 9,305,825.

(51) Int. Cl.

| | |
|---|---|
| *H01L 29/06* | (2006.01) |
| *H01L 27/088* | (2006.01) |
| *H01L 21/84* | (2006.01) |
| *H01L 21/265* | (2006.01) |
| *H01L 21/763* | (2006.01) |

(52) U.S. Cl.
CPC ........ *H01L 21/823431* (2013.01); *H01L 21/823481* (2013.01); *H01L 21/845* (2013.01); *H01L 27/0886* (2013.01); *H01L 29/0649* (2013.01); *H01L 29/0657* (2013.01)

(56) References Cited

U.S. PATENT DOCUMENTS

| | | | |
|---|---|---|---|
| 7,994,020 | B2 | 8/2011 | Lin et al. |
| 8,058,161 | B2 | 11/2011 | Barna et al. |
| 8,461,008 | B2 | 6/2013 | Cho |
| 9,728,535 | B2 * | 8/2017 | Youn ................ H01L 21/76229 |
| 10,090,190 | B2 * | 10/2018 | Youn ................ H01L 21/76229 |
| 2005/0153490 | A1 | 7/2005 | Yoon et al. |
| 2005/0184356 | A1 | 8/2005 | Cheng et al. |
| 2006/0214212 | A1 | 9/2006 | Horita et al. |
| 2007/0158756 | A1 | 7/2007 | Dreeskornfeld et al. |
| 2009/0294857 | A1 | 12/2009 | Lee |
| 2010/0015778 | A1 | 1/2010 | Lin et al. |
| 2010/0283108 | A1 | 11/2010 | Sawada et al. |
| 2011/0068405 | A1 | 3/2011 | Yuan et al. |
| 2011/0095372 | A1 * | 4/2011 | Yuan ................ H01L 21/76229 257/368 |
| 2011/0097889 | A1 | 4/2011 | Yuan et al. |
| 2012/0025316 | A1 | 2/2012 | Schultz |
| 2012/0032267 | A1 | 2/2012 | Cheng et al. |
| 2012/0091511 | A1 | 4/2012 | Chen et al. |
| 2013/0244387 | A1 * | 9/2013 | Cho ................ H01L 21/76224 438/283 |
| 2014/0117462 | A1 | 5/2014 | Cheng et al. |

FOREIGN PATENT DOCUMENTS

| | | |
|---|---|---|
| KR | 10-2009-0079729 | 7/2009 |
| KR | 10-2011-0049806 | 7/2016 |

* cited by examiner

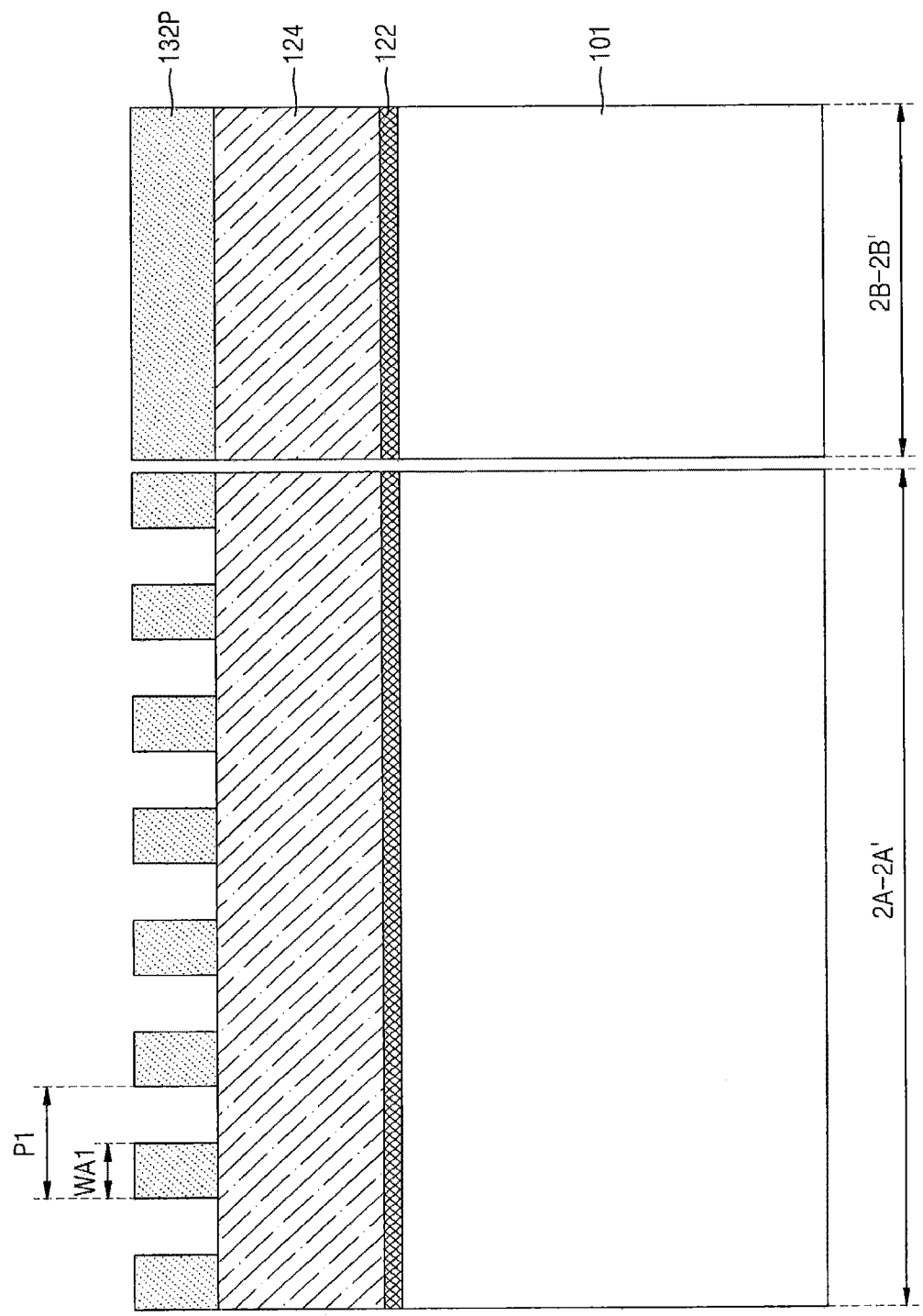

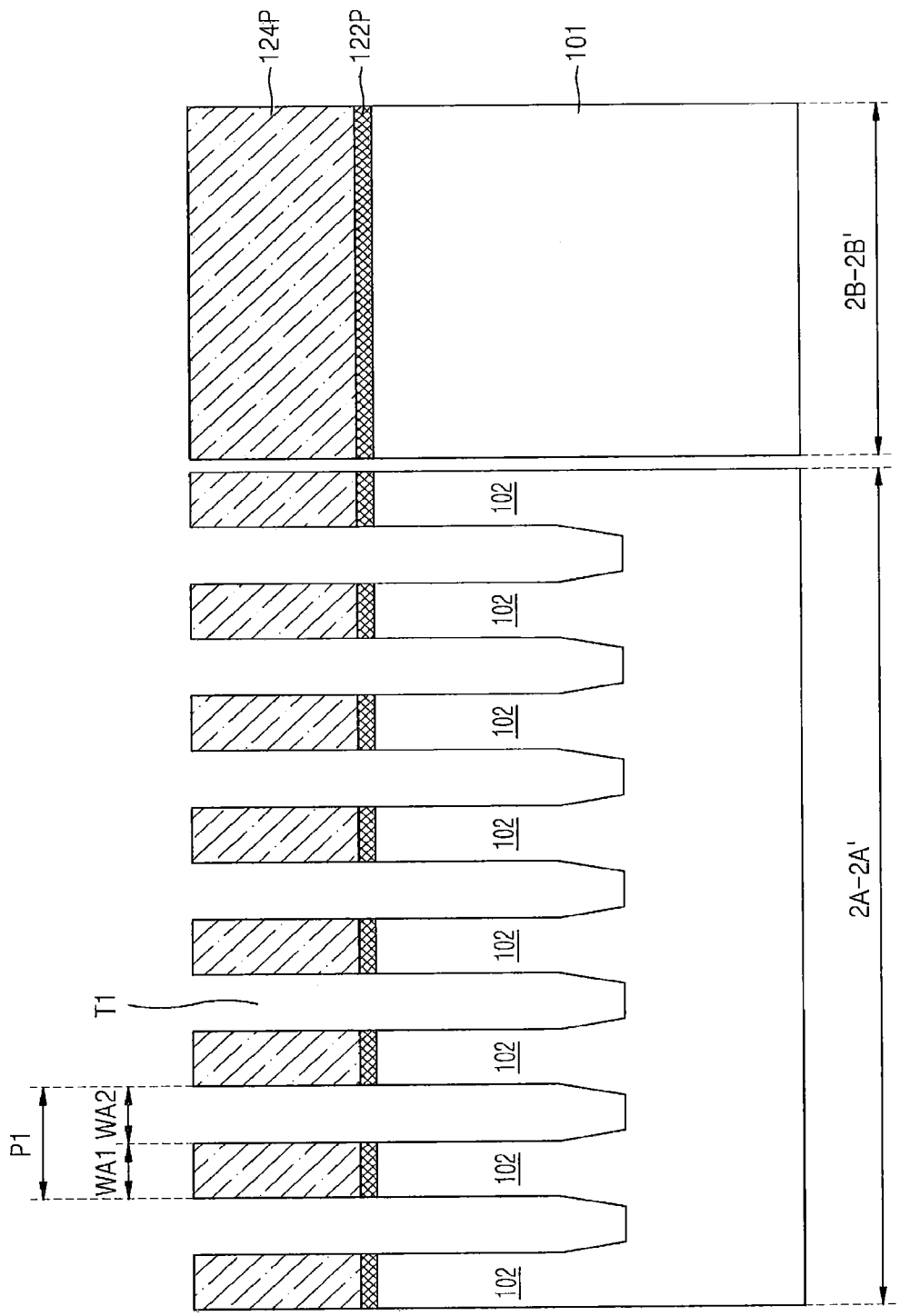

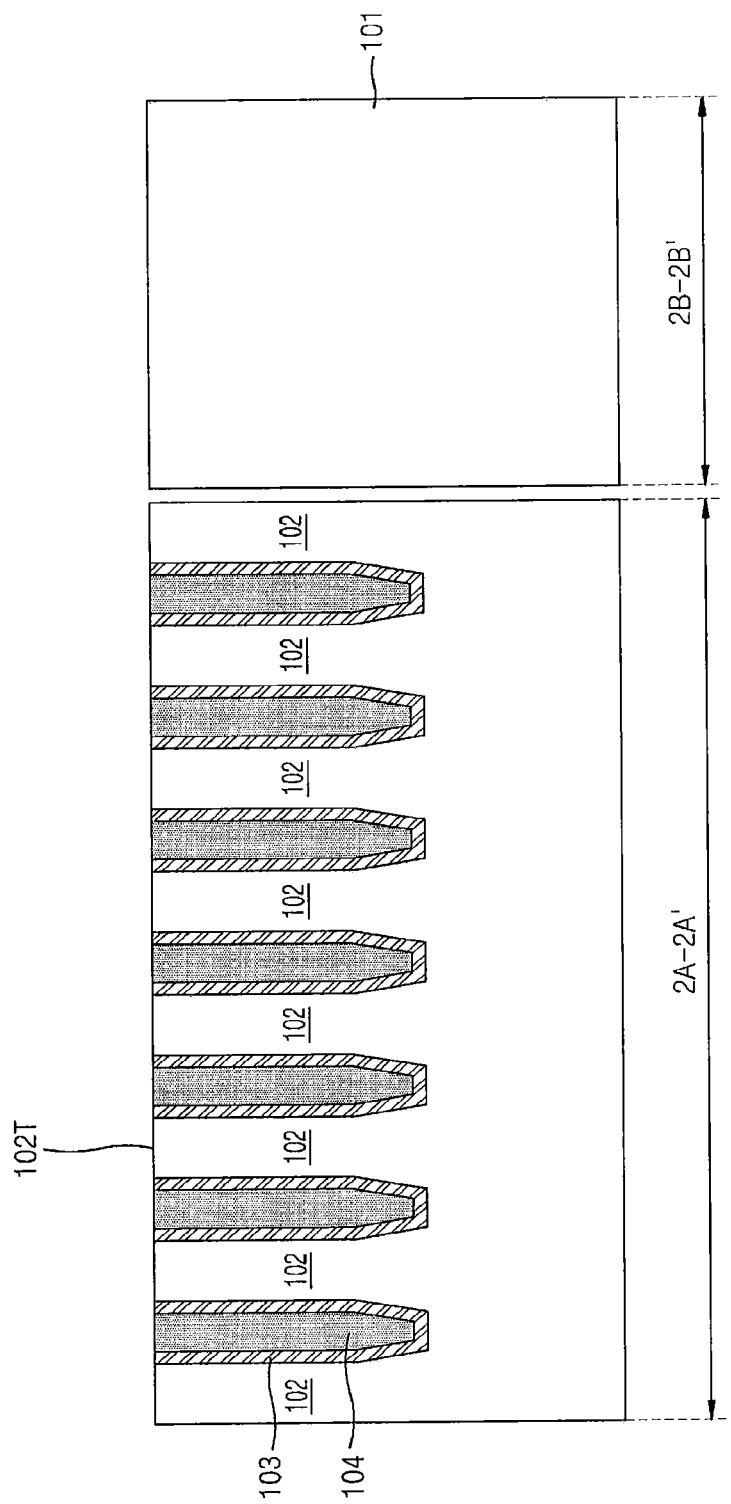

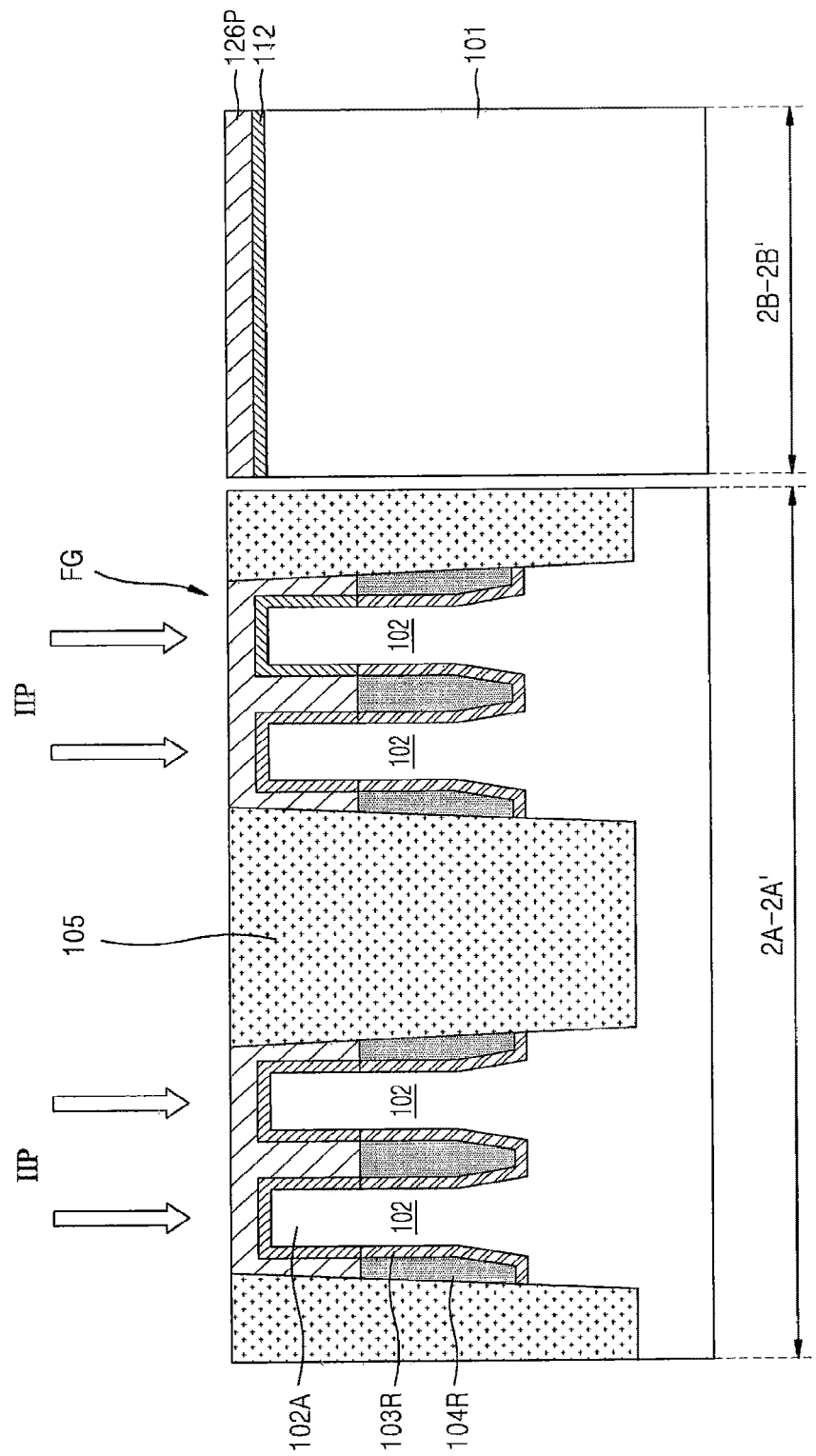

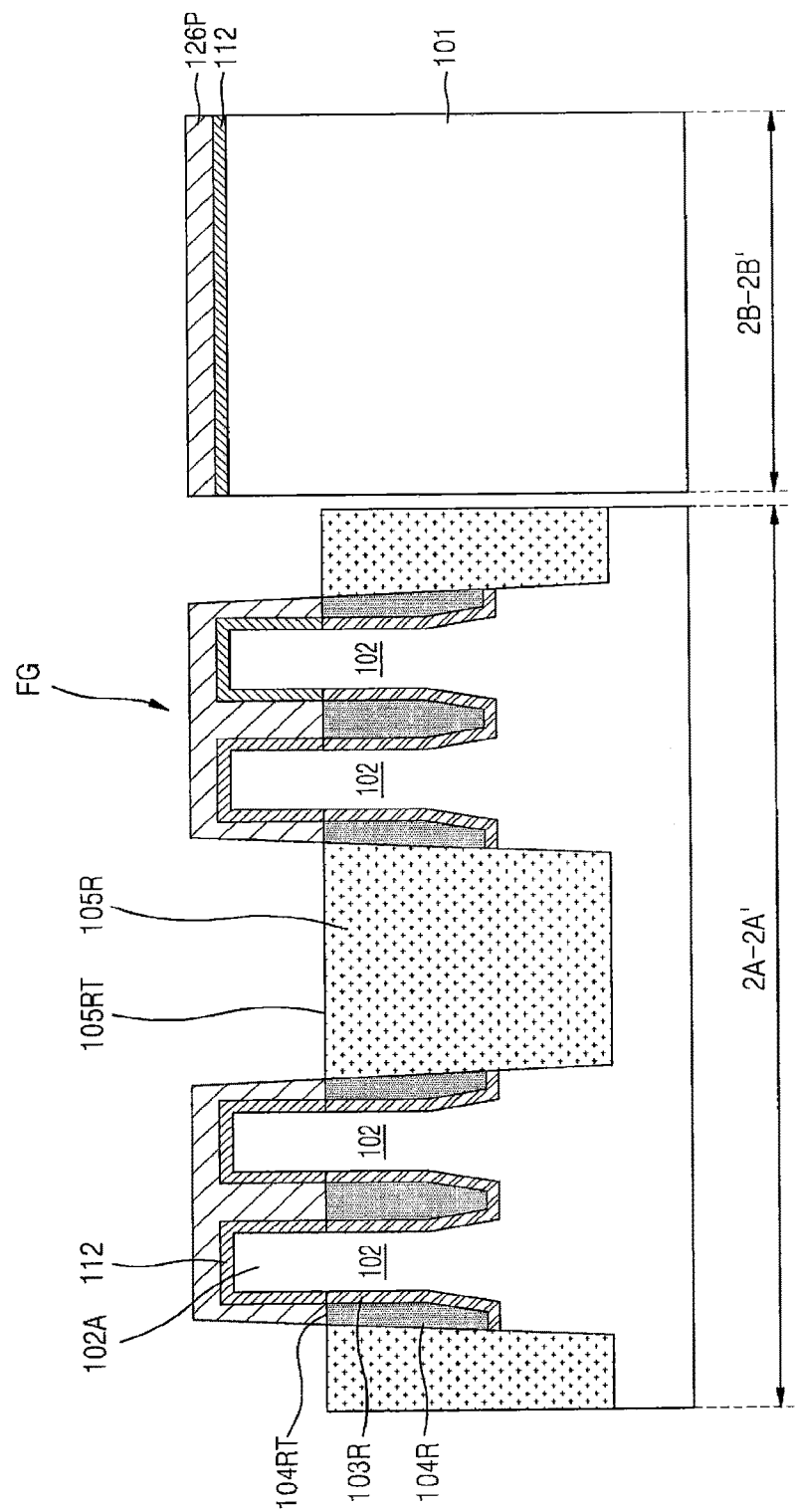

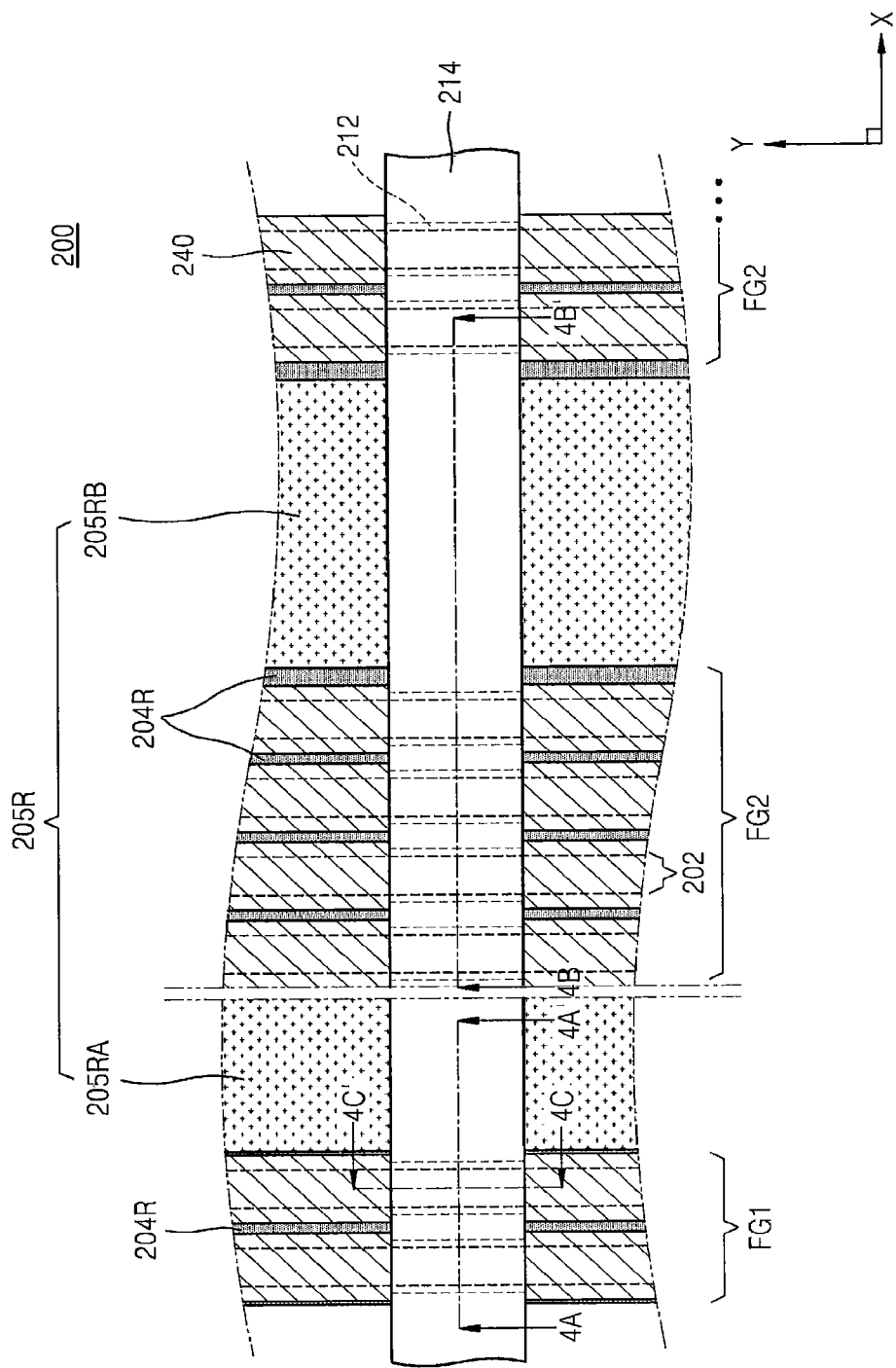

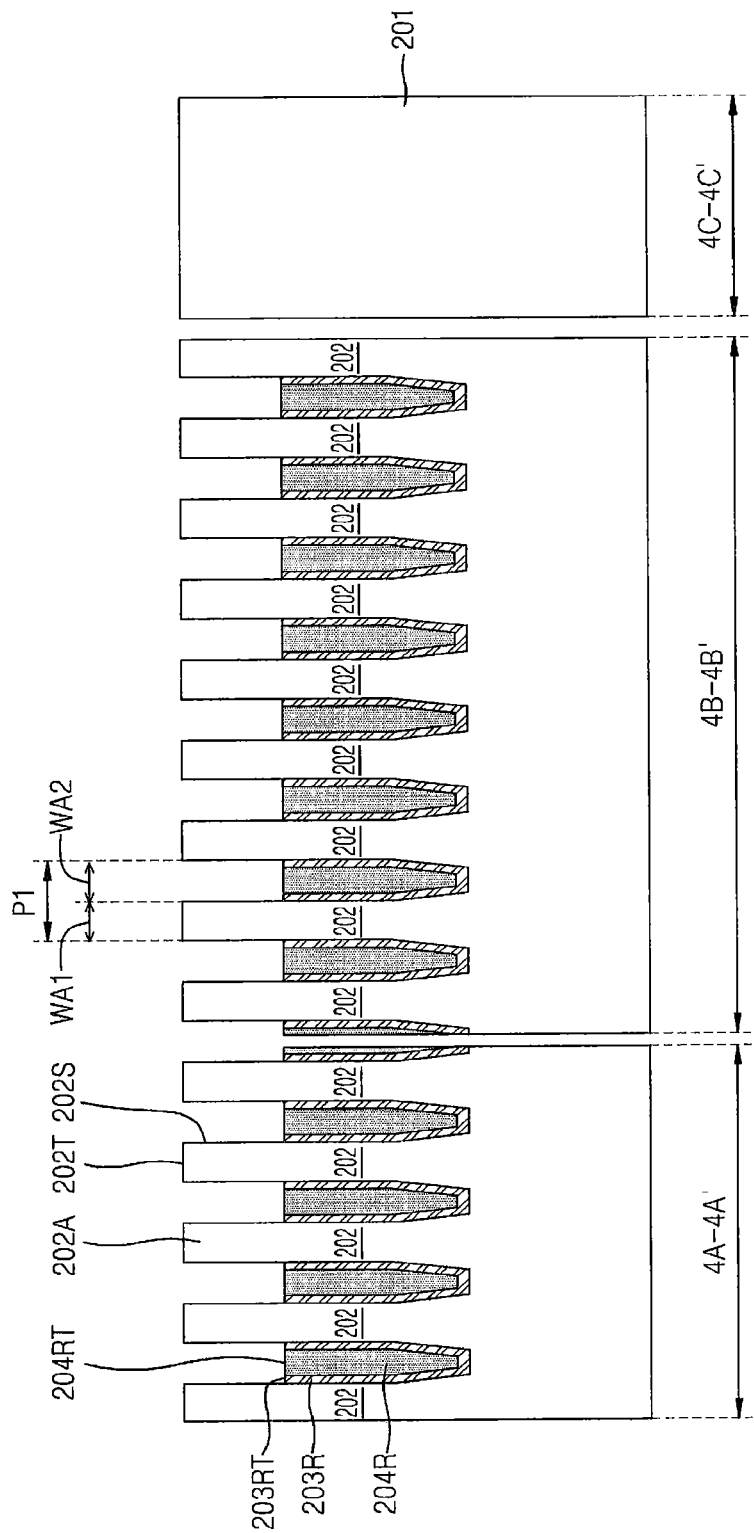

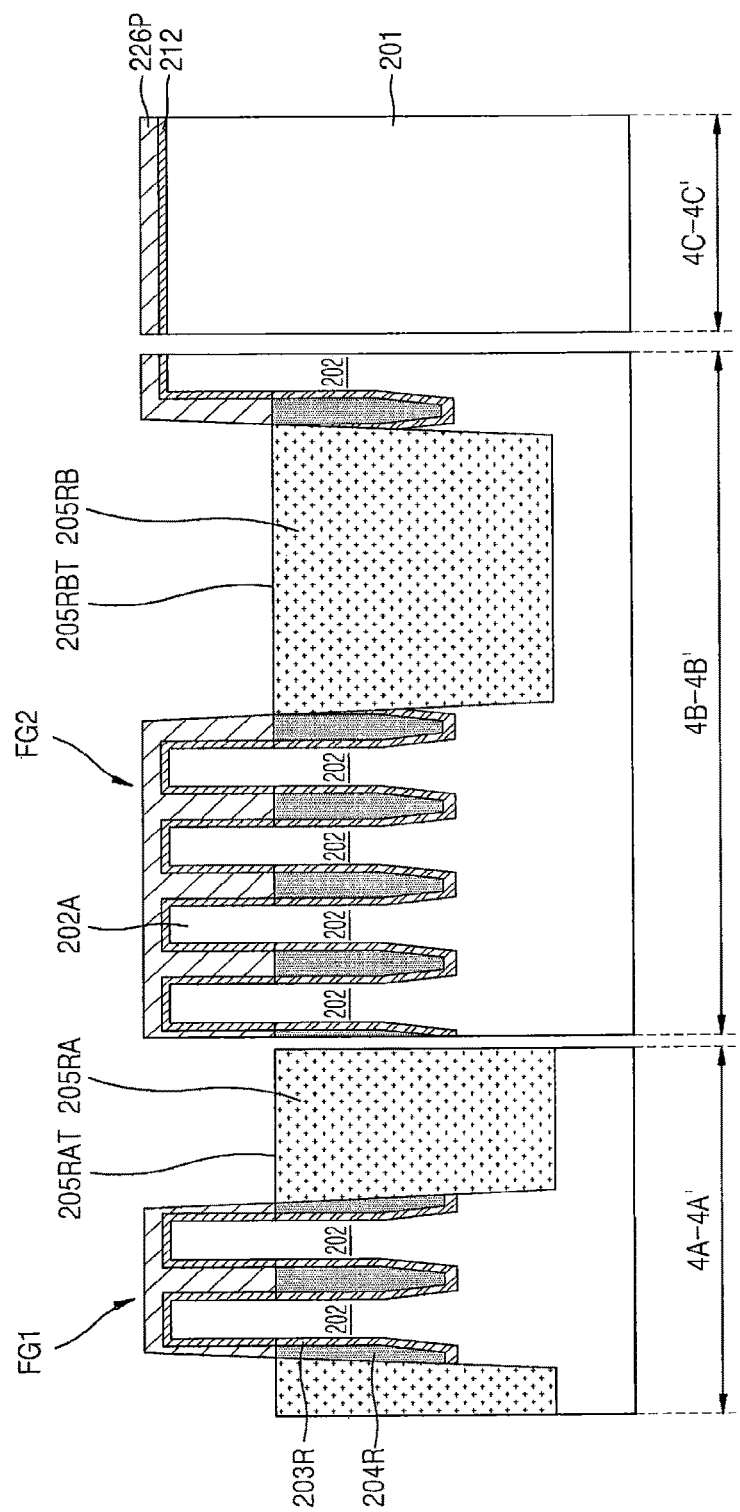

METHODS OF FABRICATING SEMICONDUCTOR DEVICES INCLUDING FIN-SHAPED ACTIVE REGIONS

CROSS-REFERENCE TO RELATED APPLICATIONS

This application is a continuation of U.S. patent application Ser. No. 15/637,552, filed on Jun. 29, 2017, which is a continuation of U.S. patent application Ser. No. 15/058,664, filed on Mar. 2, 2016, now U.S. Pat. No. 9,728,535, which is a continuation of U.S. patent application Ser. No. 14/175,212 filed on Feb. 7, 2014, now U.S. Pat. No. 9,305,825, which claims priority under 35 U.S.C. 119 to Korean Patent Application No. 10-2013-0014656, filed on Feb. 8, 2013, in the Korean Intellectual Property Office, the disclosure of which is incorporated by reference herein in its entirety.

BACKGROUND

Embodiments of the inventive concepts relate to methods of manufacturing semiconductor devices, and more particularly, to method of manufacturing semiconductor devices including a fin-type field effect transistors (FinFETs).

As semiconductor devices become more highly integrated, the gate length of a FET gradually becomes longer. Accordingly, in order to address some limitations of device characteristics with respect to metal oxide semiconductor FETs (MOSFETs), efforts have been made to develop semiconductor devices including FinFETs with a channel having a 3-dimensional structure.

SUMMARY

Embodiments of the inventive concepts provide methods of manufacturing semiconductor devices having improved performance by reducing or minimizing the deviation in electrical characteristics of fin-type field effect transistors (FinFETs) formed on one or the same substrate.

According to some embodiments of the inventive concepts, a method of fabricating a semiconductor device includes forming first trenches uniformly spaced at a first pitch in a substrate. A first device isolating layer is formed in the first trenches to define fin-shaped active regions between the first trenches. The fin-shaped active regions protrude from a surface of the first device isolating layer in the first trenches. After forming the device isolating layer to define the fin-shaped active regions, second trenches are formed in the substrate to define respective fin groups including ones of the fin-shaped active regions. Each of the fin-shaped active regions includes source/drain regions therein and a channel region therebetween.

In some embodiments, the second trenches may be respectively spaced at a second pitch greater than the first pitch between the first trenches.

In some embodiments, forming the second trenches may remove ones of the fin-shaped active regions and portions of the first device isolating layer therebetween to divide the fin-shaped active regions into the respective fin groups.

In some embodiments, a second device isolating layer may be formed in the second trenches between the respective fin groups such that a surface of the second device isolating layer in the second trenches may be coplanar with the surface of the first device isolating layer in the first trenches.

In some embodiments, an insulating liner may be formed along sidewalls of the first trenches prior to forming the first device isolating layer therein. After forming the first device isolating layer, the surface of the first device isolating layer may be coplanar with a surface of the insulating liner.

In some embodiments, the second trenches may have differing widths and/or may be respectively spaced at differing pitches.

In some embodiments, the respective fin groups may include a differing number of the ones of the plurality of fin-shaped active regions.

According to an aspect of the inventive concept, there is provided a method of manufacturing a semiconductor device, the method including: forming a plurality of fins by forming a plurality of first device isolating trenches repeated at a first pitch in a substrate; a plurality of fin-type active areas protruding from a top surface of a first device isolating layer by forming the first device isolating layer in the plurality of first device isolating trenches; and forming a plurality of second device isolating trenches at a pitch different from the first pitch by etching a portion of the substrate and the first device isolating layer, forming a second device isolating layer in the plurality of second device isolating trenches, so as to form a plurality of fin-type active area groups separated from each other with the second device isolating layer therebetween.

The pitch of the plurality of second device isolating trenches may be greater than the first pitch.

A width of the plurality of second device isolating trenches may be greater than a width of the plurality of first device isolating trenches.

A distance from a top surface of the plurality of fin-type active areas to a bottom surface of the second device isolating layer may be greater than a distance from the top surface of the plurality of fin-type active areas to a bottom surface of the first device isolating layer.

The plurality of fin-type active area groups may include at least one fin-type active area among the plurality of fin-type active areas.

The plurality of fin-type active area groups may include at least two fin-type active area groups where the second device isolating layer is repeated at different pitches.

The plurality of second device isolating trenches may include at least two device isolating trenches having different widths.

The defining of the plurality of fin-type active areas may include: forming a first preliminary device isolating layer filling the plurality of first device isolating trenches and covering the plurality of fins; exposing some of the plurality of fins from the first preliminary device isolating layer by planarizing the first preliminary device isolating layer; and forming the first device isolating layer and exposing a portion of sides of the plurality of fins by removing a portion of the first preliminary device isolating layer from the plurality of first device isolating trenches.

The defining of the plurality of fin-type active areas may include: forming a preliminary liner insulating layer covering sidewalls and bottom surfaces of the plurality of first device isolating trenches; forming a first preliminary device isolating layer filling the plurality of first device isolating trenches and covering the plurality of fins on the preliminary liner insulating layer; exposing some of the plurality of fins from the preliminary liner insulating layer and the first preliminary device isolating layer by planarizing the first preliminary device isolating layer; and forming a liner insulating layer and the first device isolating layer in the plurality of first device isolating trenches and exposing a portion of sides of the plurality of fins by removing a portion the preliminary liner insulating layer and the first preliminary device isolating layer.

The forming of the plurality of fin-type active area groups may include: forming a sacrificial layer covering the plurality of fin-type active areas on the first device isolating layer; forming the plurality of second device isolating trenches by patterning the substrate, the first device isolating layer, and the sacrificial layer; forming a second preliminary device isolating layer filling the plurality of second device isolating trenches and covering the sacrificial layer; exposing the sacrificial layer from the second preliminary device isolating layer by planarizing the second preliminary device isolating layer; forming the second device isolating layer by removing a portion of the second preliminary device isolating layer in the plurality of second device isolating trenches; and removing the sacrificial layer.

The forming of the plurality of fin-type active area groups may further include: forming a sacrificial layer covering the plurality of fin-type active areas on the first device isolating layer; forming the plurality of second device isolating trenches by patterning the substrate, the first device isolating layer, and the sacrificial layer; forming a second preliminary device isolating layer filling the plurality of second device isolating trenches and covering the sacrificial layer; exposing the sacrificial layer from the second preliminary device isolating layer by planarizing the second preliminary device isolating layer; doping the plurality of fin-type active areas with an impurity by injecting the impurity to the plurality of fin-type active area groups through the sacrificial layer; forming the second device isolating layer by removing a portion of the second preliminary device isolating layer in the plurality of second device isolating trenches; and removing the sacrificial layer.

The method may further include, before the forming of the plurality of fin-type active area groups after the defining of the plurality of fin-type active areas, forming a first insulating layer covering an exposed surface of the plurality of fin-type active areas, wherein when a portion of the substrate and the first device isolating layer is etched during the forming of the plurality of fin-type active areas, a portion of the first insulating layer may be etched at the same time.

The method may further include, before the forming of the plurality of fin-type active area groups after the defining of the plurality of fin-type active areas, forming a first insulating layer covering an exposed surface of the plurality of fin-type active areas; and after the forming of the plurality of fin-type active area groups, forming a conductive line extending in a direction intersecting the plurality of fin-type active areas on the first insulating layer.

The method may further include, after the forming of the plurality of fin-type active area groups, forming a second insulating layer covering an exposed surface of the plurality of fin-type active area groups; and forming a conductive line extending in a direction intersecting the plurality of fin-type active areas on the second insulating layer.

According to another aspect of the inventive concept, there is provided a method of manufacturing a semiconductor device, the method including: forming a plurality of fins by forming a plurality of first device isolating trenches in a substrate; defining a plurality of fin-type active areas protruding from a top surface of a first device isolating layer by forming the first device isolating layer in the plurality of first device isolating trenches; forming a plurality of mask patterns repeatedly disposed at a predetermined pitch to cover an active area group including at least one fin-type active area among the plurality of fin-type active areas; and forming a plurality of second device isolating trenches separated from each other with a width that is greater than a width of the plurality of first device isolating trenches in the substrate by etching the substrate and the first device isolating layer with the plurality of mask patterns as an etching mask.

Other methods and/or devices according to some embodiments will become apparent to one with skill in the art upon review of the following drawings and detailed description. It is intended that all such additional embodiments, in addition to any and all combinations of the above embodiments, be included within this description, be within the scope of the inventive concepts, and be protected by the accompanying claims.

BRIEF DESCRIPTION OF THE DRAWINGS

Exemplary embodiments of the inventive concepts will be more clearly understood from the following detailed description taken in conjunction with the accompanying drawings in which:

FIGS. 3A and 3B are plan views illustrating a portion of a semiconductor device according to some other embodiments of the present inventive concepts.

FIGS. 4A to 4H are cross-sectional views in a processing order to illustrate methods of manufacturing a semiconductor device, according to some embodiments of the present inventive concepts.

DETAILED DESCRIPTION OF EMBODIMENTS

Figure 1A:
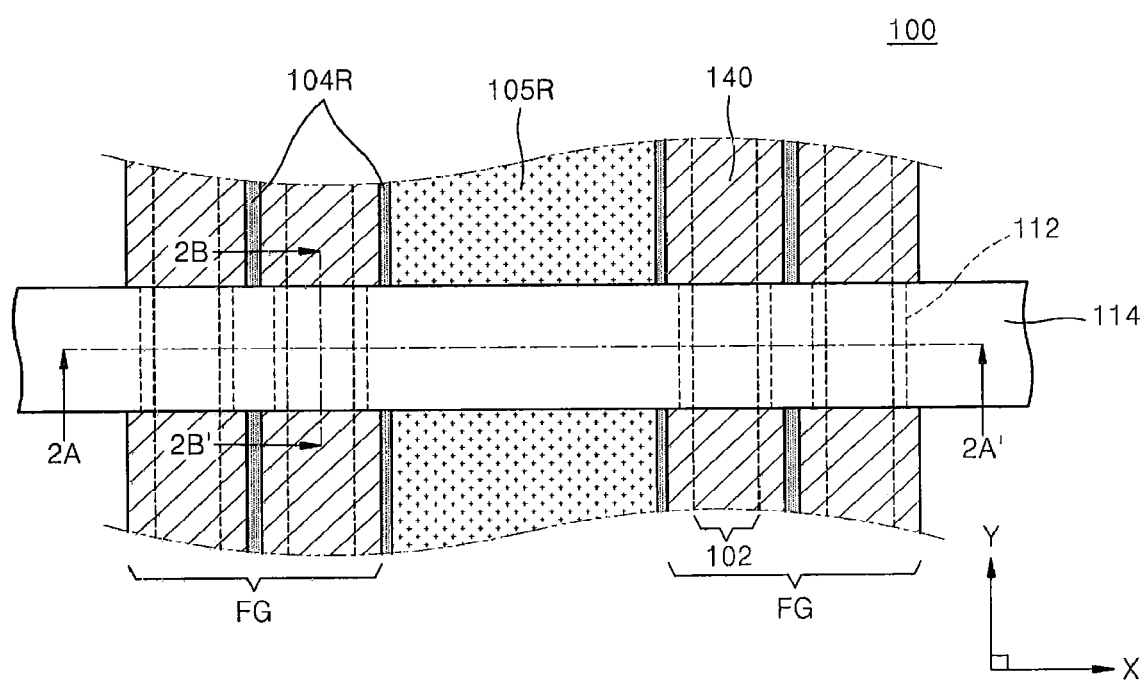
FIG. 1A is a plan view illustrating a portion of a semiconductor device according to some embodiments of the present inventive concepts.

Hereinafter, embodiments of the present inventive concepts will be described in more detail with reference to the accompanying drawings. Like reference numerals refer to like elements, accordingly, their repeated descriptions are omitted for conciseness.

The inventive concepts may, however, be embodied in many different forms and should not be construed as being limited to the embodiments set forth herein; rather, these embodiments are provided so that this disclosure will be thorough and complete, and will fully convey the concept of the inventive concepts to those skilled in the art.

Also, though terms like 'first' and 'second' are used to describe various members, components, regions, layers, and/or portions in various embodiments of the present inventive concepts, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment can be referred to as a second member, a second component, a second region, a second layer, or a second portion in another embodiment. For example, a first component may be referred to as a second component and vice versa without departing from the scope of the present invention.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms used herein include technical terms and scientific terms, and also have the same meanings that those of ordinary skill in the art commonly understand. Additionally, it should be understood that typically used terms defined in dictionaries have consistent meanings in related technical contents, and if not explicitly defined, should not be interpreted as being excessive formal meanings.

When an implementation is possible different from an embodiment, a specific fabrication order may be different from that in the description. For example, two described continuous processes may be substantially performed at the same time or may be performed in the reverse order.

In the accompanying drawings, the forms therein may be modified depending on manufacturing techniques and/or processes. Accordingly, embodiments of the present invention should not be construed as being limited to the specific forms shown in the drawings, and for example, should include changes in forms resulting from manufacturing processes.

Figure 1B:
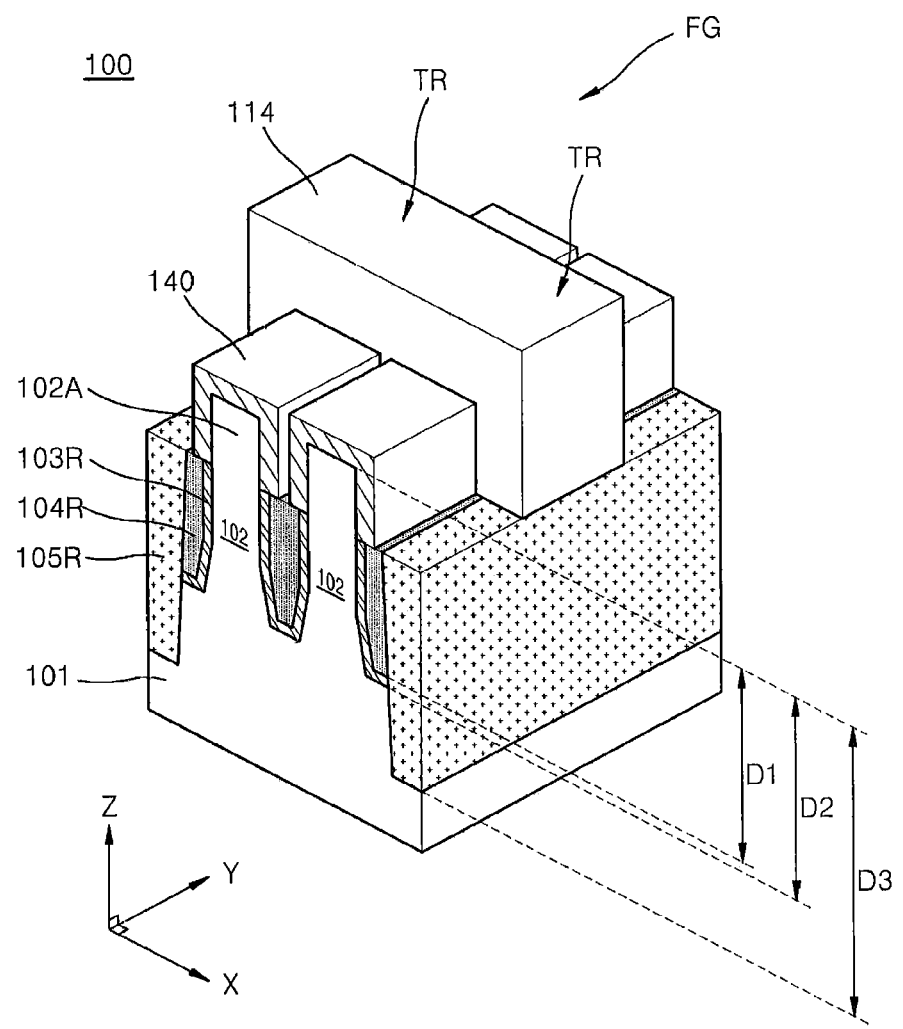
FIG. 1B is a perspective view of the semiconductor device of FIG. 1A.

FIG. 1A is a plan view illustrating a main part configuration of a semiconductor device 100 according to an embodiment of the present invention. FIG. 1B is a perspective view of the semiconductor device 100 of FIG. 1B.

Referring to FIGS. 1A and 1B, the semiconductor device 100 may include a plurality of fins 102 protruding from a substrate 101. The substrate 101 may include silicon, such as crystalline silicon, polycrystalline silicon, or amorphous silicon. In some embodiments, the substrate 101 may include germanium or a compound semiconductor, such as silicon germanium, silicon carbide, gallium arsenide, indium arsenide, or indium phosphide. In some embodiments, the substrate 101 may have a silicon on insulator (SOI) structure. For example, the substrate 101 may include a buried oxide (BOX) layer. In some embodiments, the substrate 101 may include a conductive region, for example, a well doped with an impurity or a structure doped with an impurity.

The plurality of fins 102 may extend in parallel to each other along a first direction (a Y direction in FIG. 1A and FIG. 1B). A liner insulating layer 103R and a first device isolating layer 104R may be formed between the plurality of fins 102. That is, the plurality of fins 102 may be mutually separated by the liner insulating layer 103R and the first device isolating layer 104R. A top surface of the liner insulating layer 103R may be coplanar with a top surface of the first device isolating layer 104R.

The liner insulating layer 103R may cover sides of the plurality of fins 102 and a top surface of the substrate 101 between the plurality of fins 102. In some embodiments, the liner insulating layer 103R may be formed of polysilicon.

The first device isolating layer 104R may fill between the plurality of fins 102, while covering the liner insulating layer 103R. In some embodiments, the first device isolating layer 104R may be formed of an oxide layer.

Each of the plurality of fins 102 may include a fin-type active area or fin-shaped active region 102A protruding above the liner insulating layer 103R and the first device isolating layer 104R. An insulating layer 112 and a semiconductor layer 140 may be formed on surfaces of the fin-type active areas 102A as described later.

The plurality of fins 102 may be spaced apart from each other by units of fin-type active area groups (FG) including at least one fin-type active area 102A. That is, the plurality of fins 102 may be grouped in a unit of the fin-type active area groups FG, and a second device isolating layer 105R may be formed between the fin-type active area groups FG and thus may be separated from each other.

Although each of the fin-type active area groups FG includes two fin-type active areas 102A in FIGS. 1A and 1B, the present inventive concepts are not limited thereto. For example, in some embodiments, each of the fin-type active area groups FG may include at least three fin-type active areas 102A. More generally, although the fin-type active area groups FG include a total of two fin-type active areas 102A in FIGS. 1A and 1B, embodiments of the present inventive concepts are not limited thereto, and in some embodiments, each of the fin-type active area groups FG may include a different number of fin-type active areas 102A (refer to FIGS. 3 to 4H), as described later.

The second device isolating layer 105R may be formed at a depth that is greater than a depth of the liner insulating layer 103R and the first device isolating layer 104R between the fin-type area groups FG in a third direction (a Z direction in FIGS. 1A and 1B). In more detail, a distance D3 from top surfaces of the plurality of fin-type active areas 102A to a bottom surface of the second device isolating layer 105R may be greater than a distance D1 from the top surfaces of the plurality of fin-type active areas 102A to a bottom surface of the liner insulating layer 103R and a distance D2 from the top surfaces of the plurality of fin-type active areas 102A to a bottom surface of the first device isolating layer 104R.

The top surface of the second device isolating layer 105R may be coplanar with the top surface of the liner insulating layer 103R and the top surface of the first device isolating layer 104R. The width in a second direction (an X direction in FIGS. 1A and 1B) of the second device isolating layer 105R may be greater than the width of the first device isolating layer 104R. In some embodiments, the second device isolating layer 105R may be formed of an oxide layer.

A conductive line 114 on the first device isolation layer 104R and the second device isolating layer 105R lying on the substrate 101 covers the top surface and both sides of each of the plurality of fin-type active areas 102A and extends in the second direction (the X direction in FIGS. 1A and 1B) intersecting the plurality of fin-type active areas 102A. The insulating layer 112 may be interposed between the conductive line 114 and the plurality of fin-type active areas 102A, on the top and both sides of each of the plurality of fin-type active areas 102A covered by the conductive line 114. As a result, a plurality of FinFETs TRs may be formed along the conductive line 114. The plurality of FinFETs TRs may be formed of a FET with a 3-dimensional structure having a channel at the top surface and both sides of the plurality of fin-type active areas 102A covered by the conductive line 114.

A source/drain area (not shown) of each of the plurality of FinFETs TRs may be formed on the top surface and both sides of each of the plurality of fin-type active areas 102A not covered by the conductive line 114. The semiconductor layer 140 may be formed on the source/drain area. The semiconductor layer 140 may cause strain in the channel of the plurality of FinFETs TRs. As shown in FIGS. 1A and 1B, the semiconductor layer 140 is formed to cover a portion of the first device isolating layer 104R, on the source/drain area, but the present invention is not limited thereto. In some embodiments, the semiconductor layer 140 may be formed separate from the first device isolating layer 104R. In some embodiments, the semiconductor layer 140 may have a polygonal, circular, or oval shape, as a vertical cross-sectional shape with respect to the first direction (the Y direction in FIG. 1A and FIG. 1B). In some embodiments, the semiconductor layer 140 may be formed of Si, Ge, C, and/or Sn.

Figure 2A:
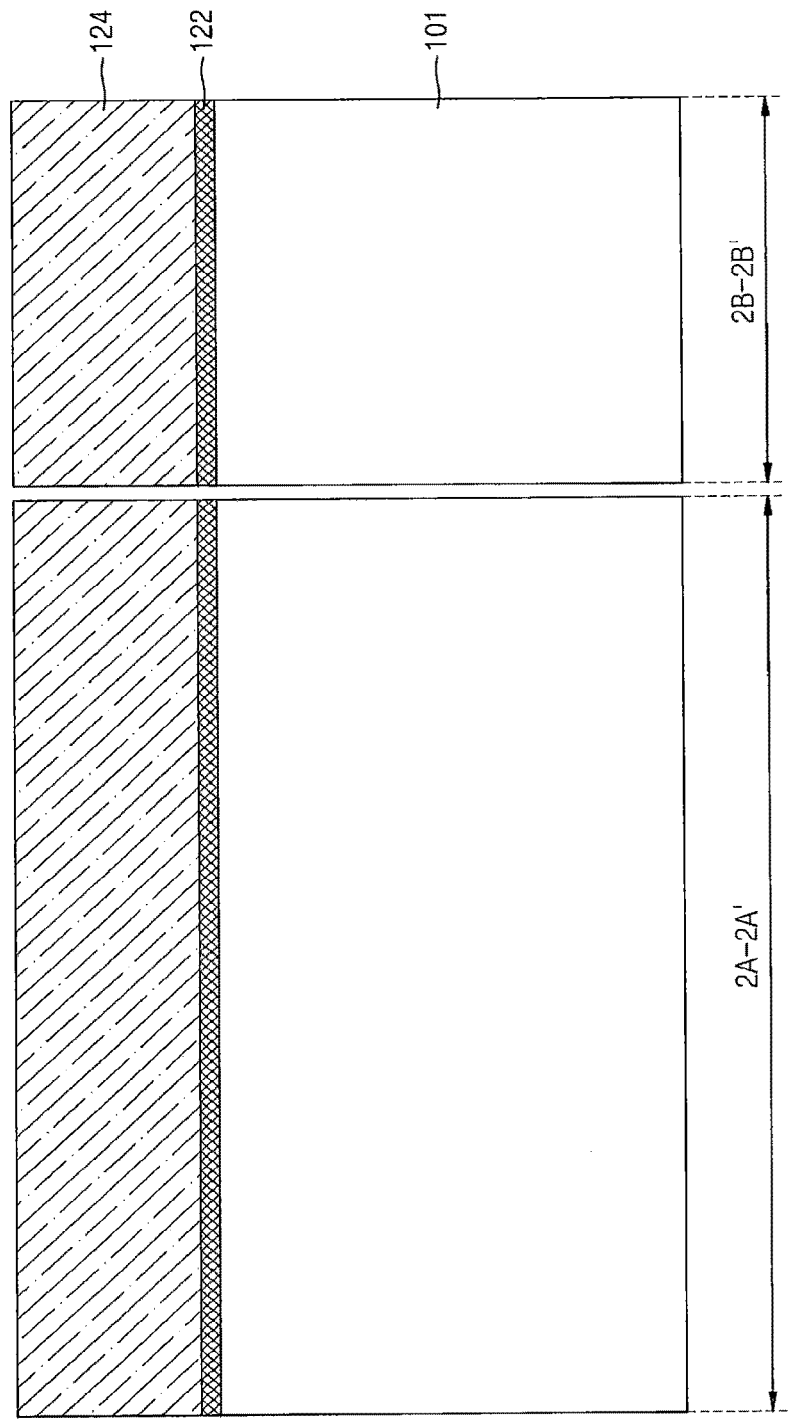
FIGS. 2A to 2P are cross-sectional views in a processing order to illustrate methods of manufacturing a semiconductor device, according to some embodiments of the present inventive concepts.
Figure 2D:
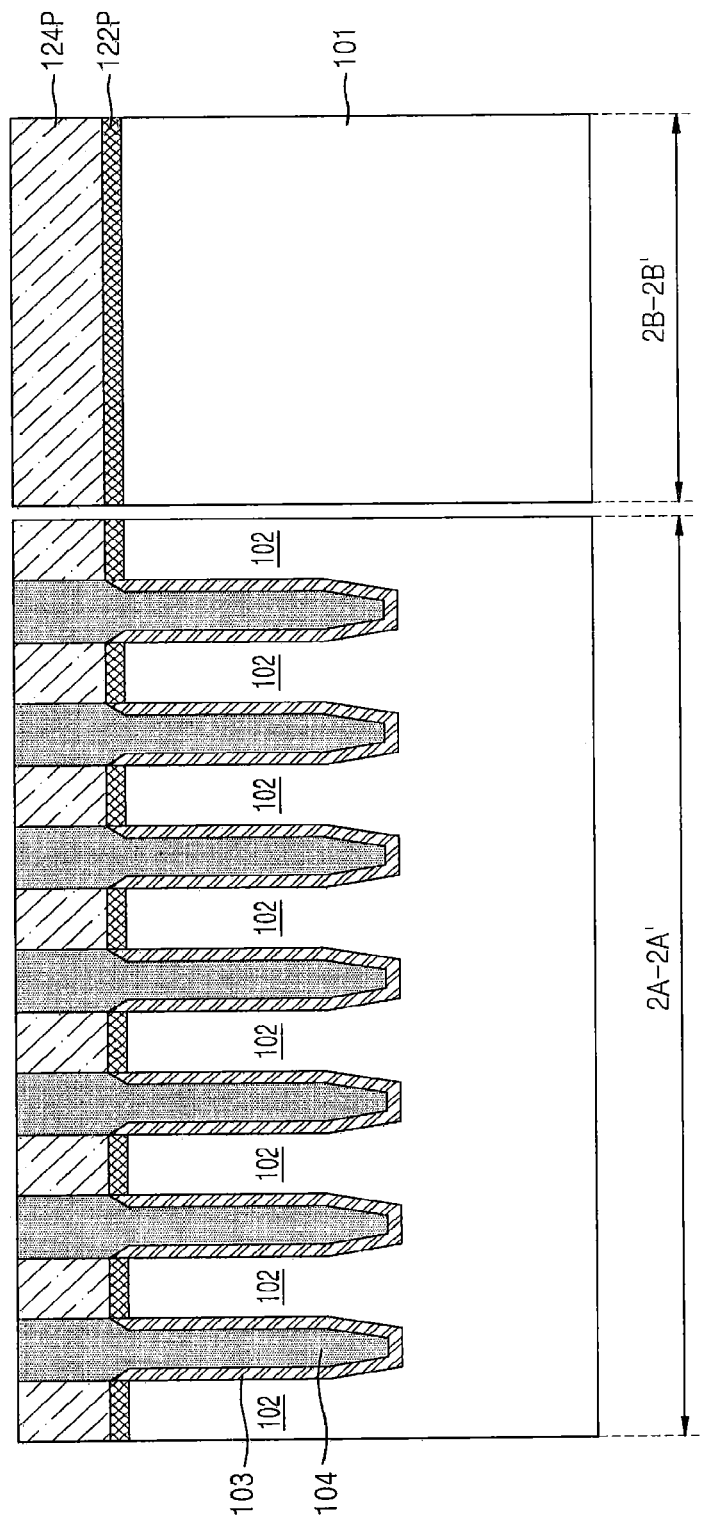
Figure 2F:
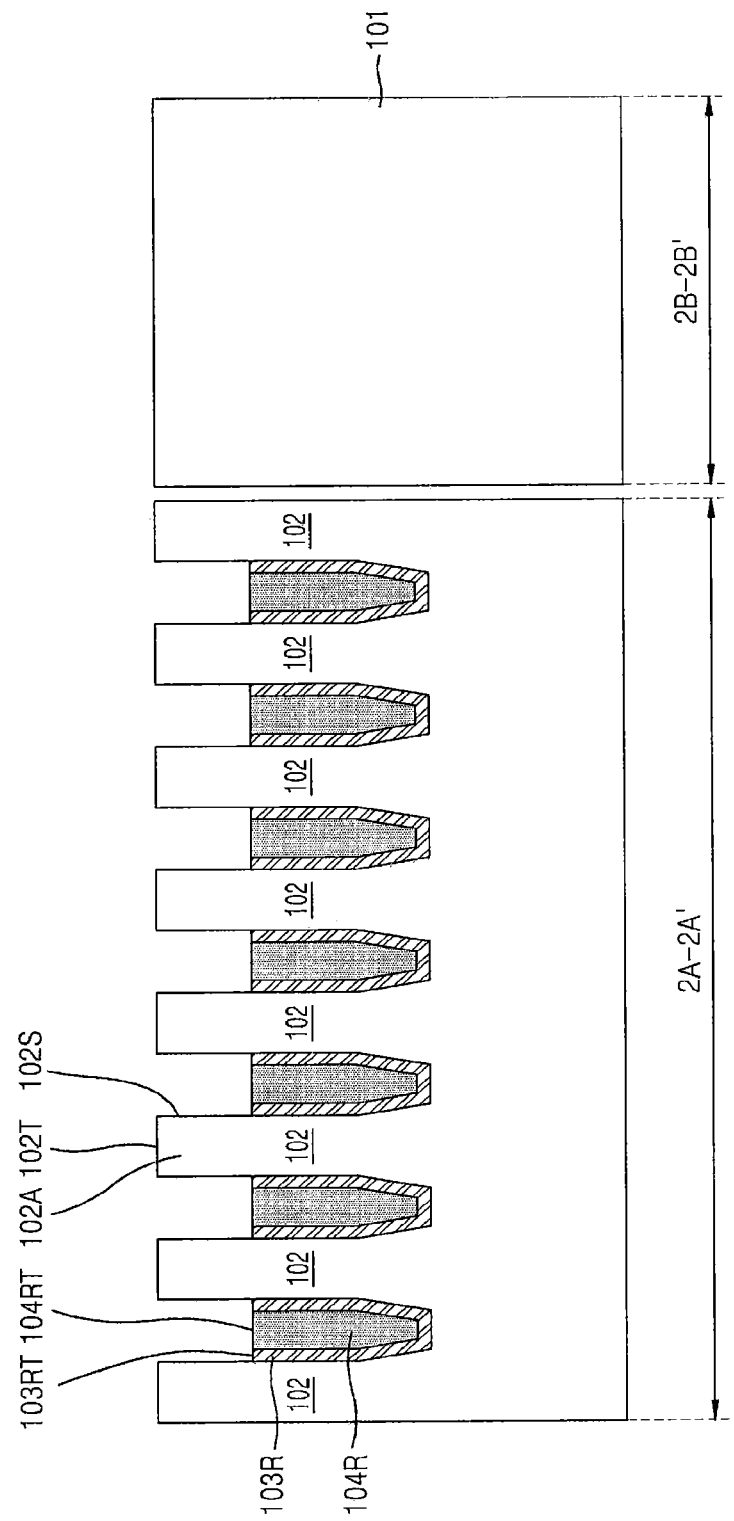
Figure 2G:
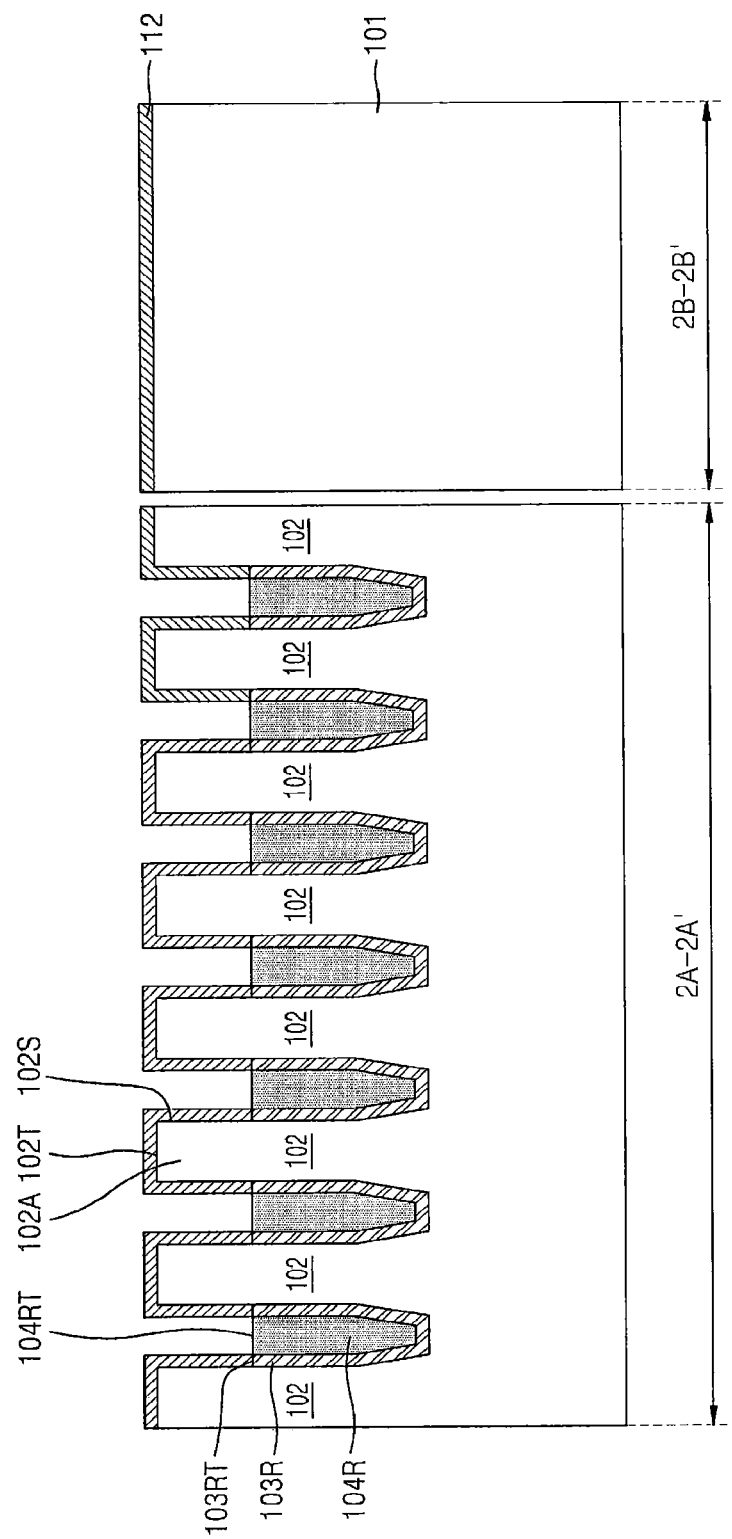
Figure 2H:
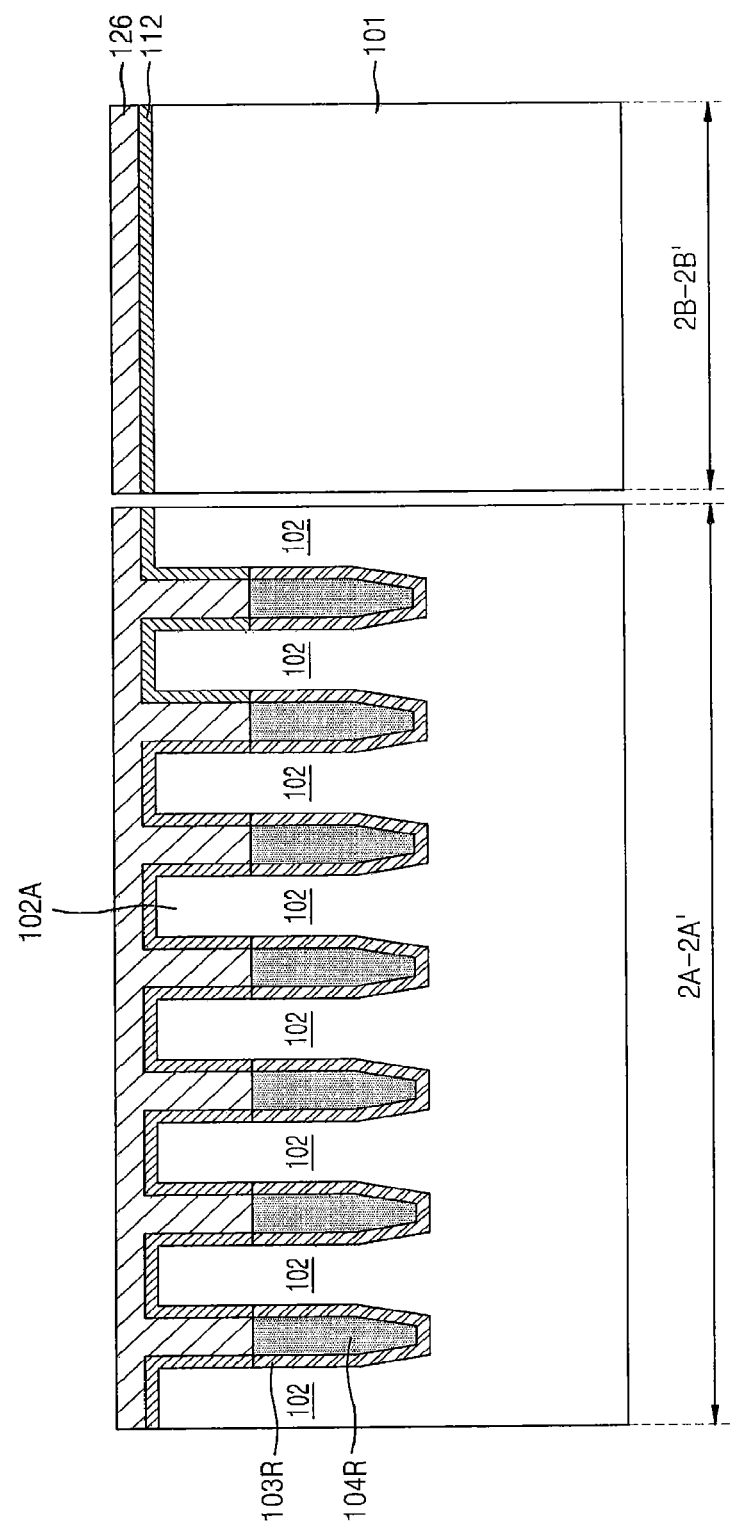
Figure 2I:
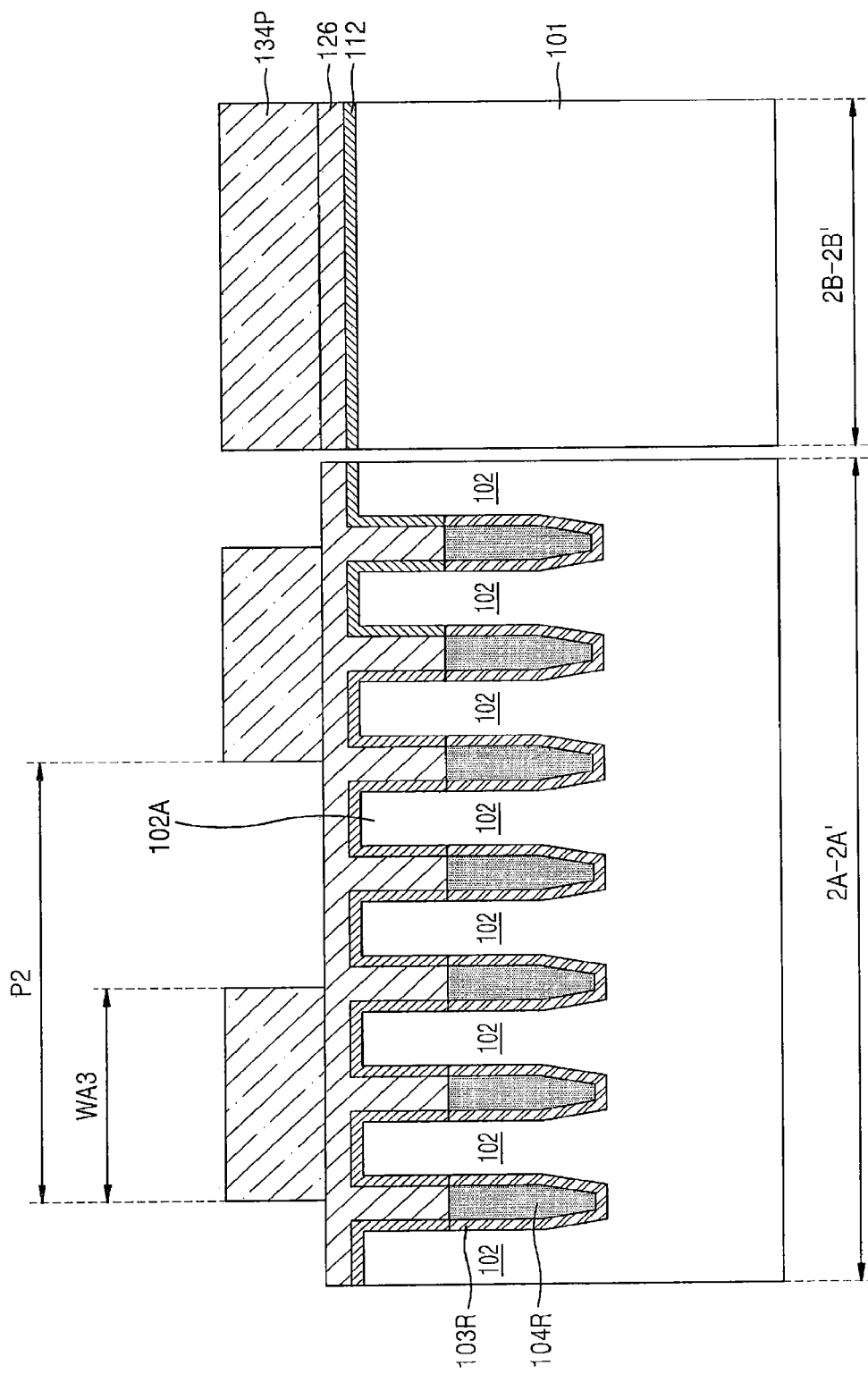
Figure 2J:
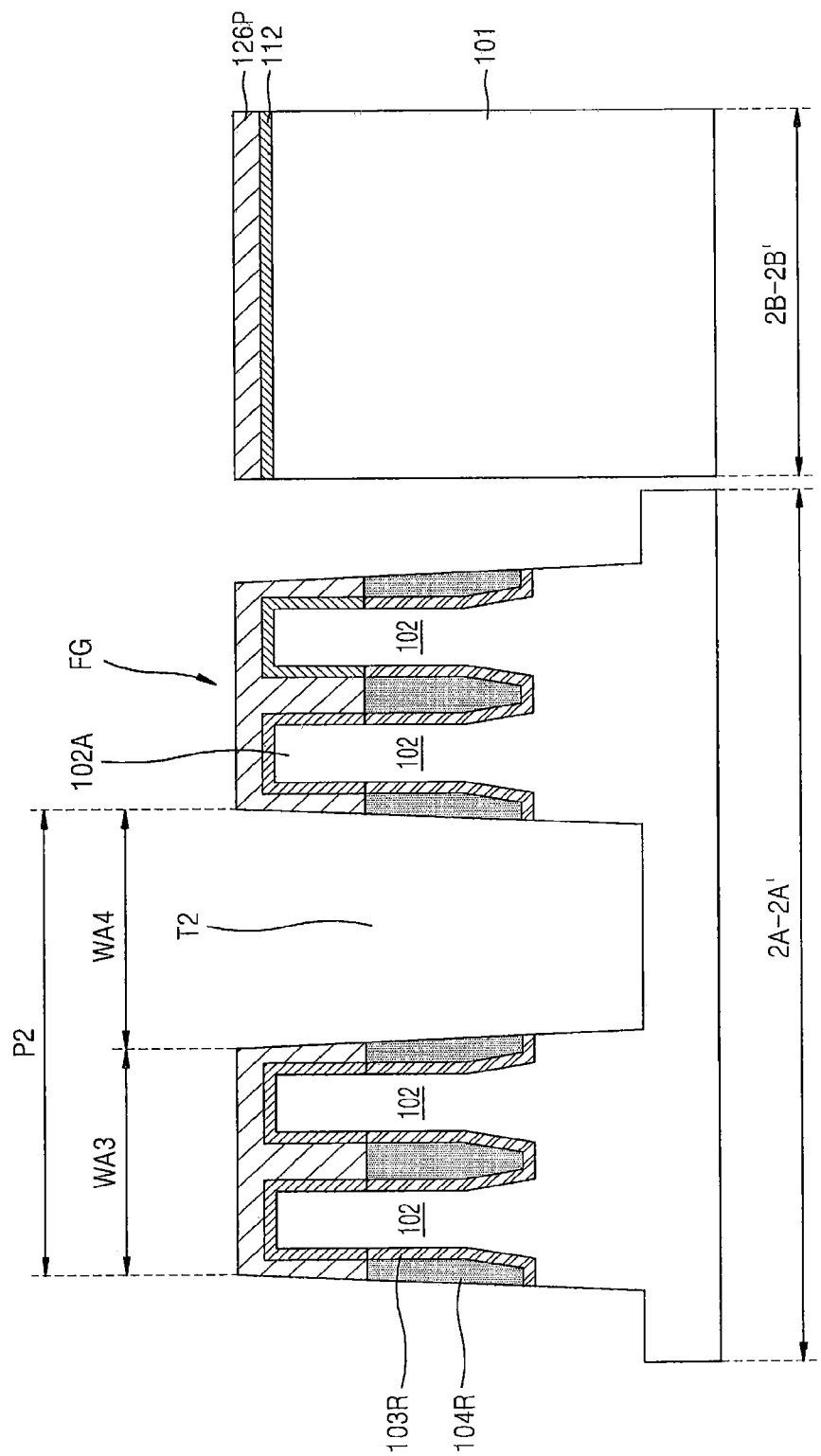
Figure 2K:
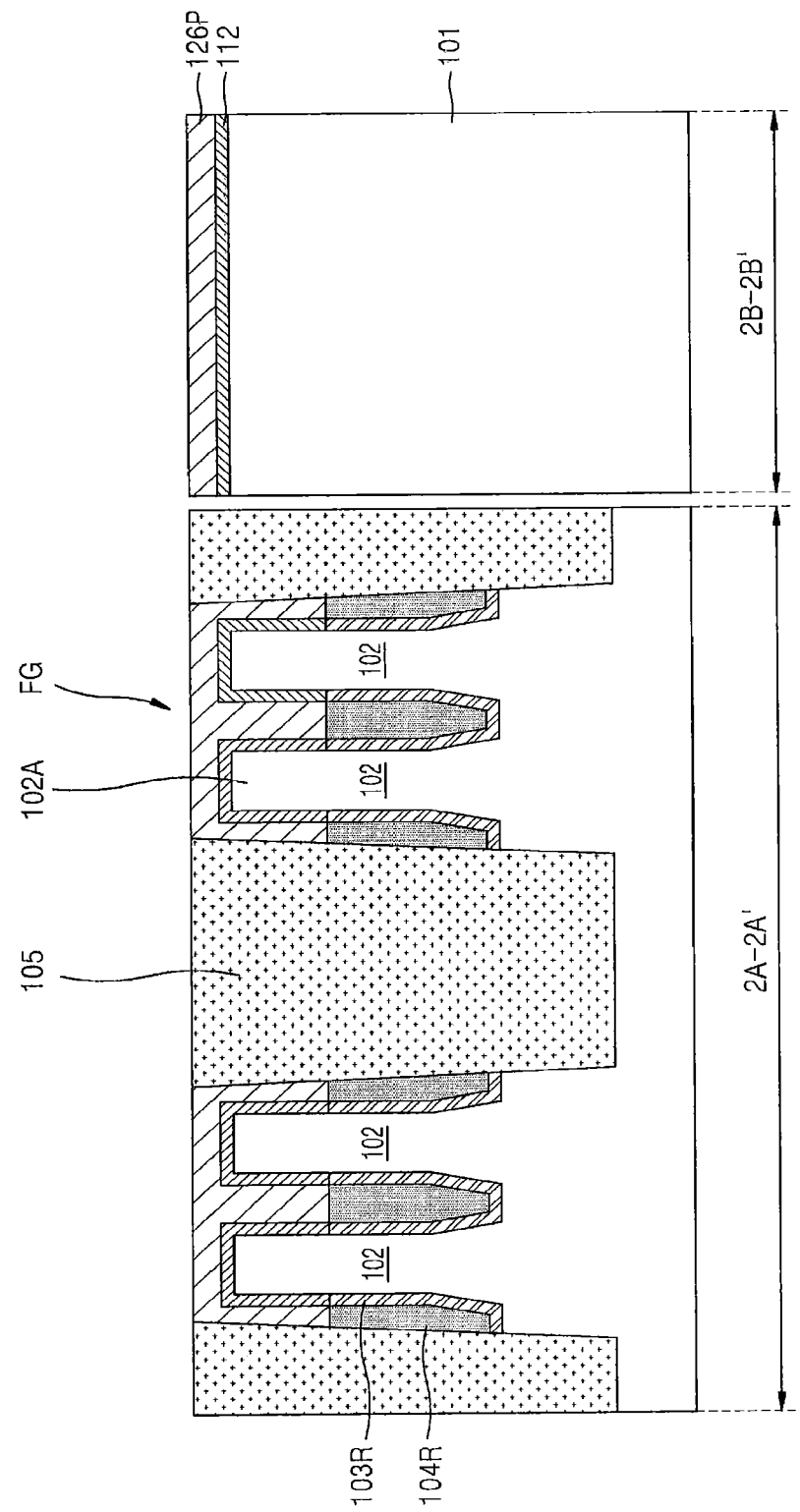
Figure 2N:
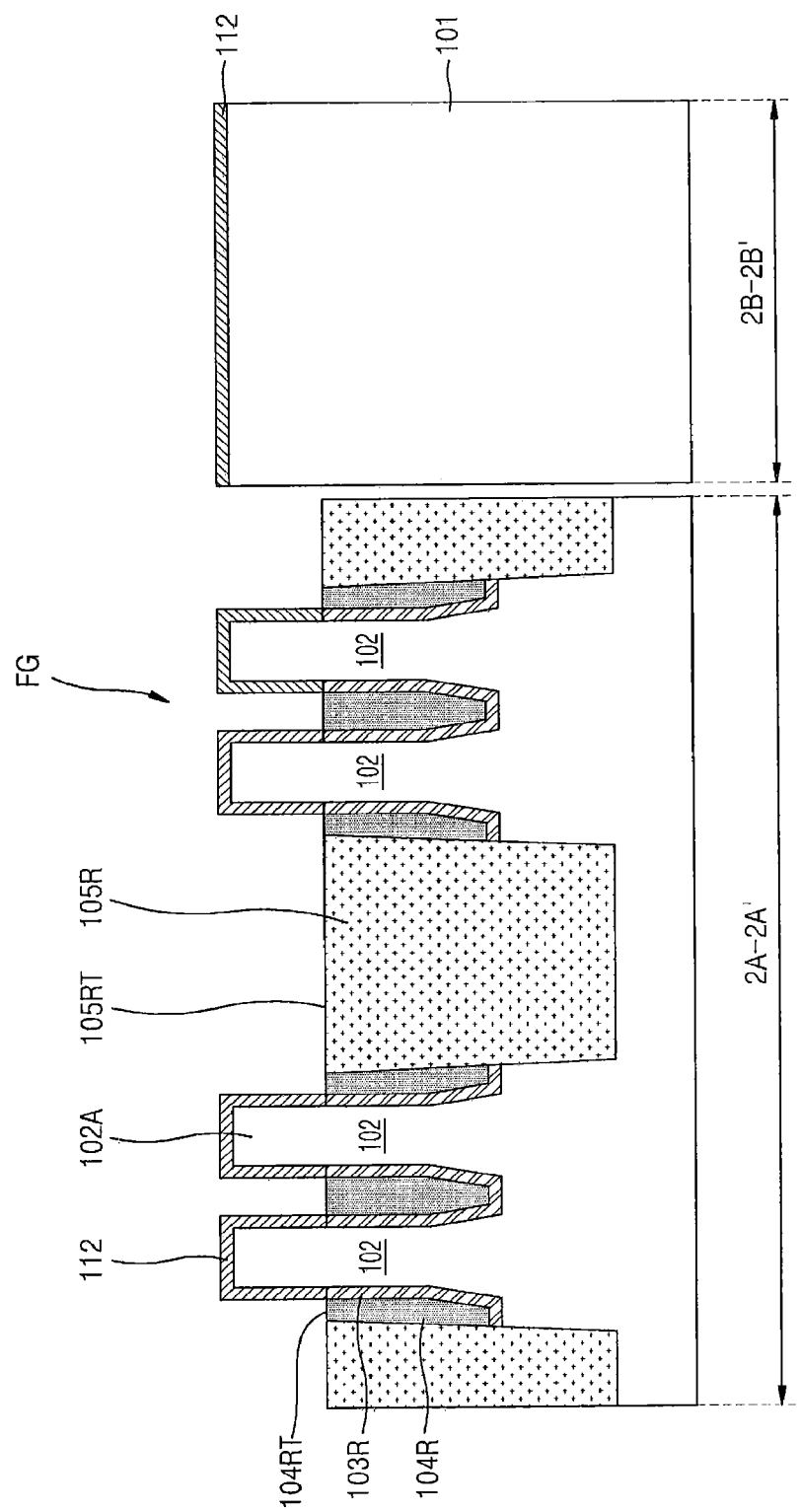
Figure 20:
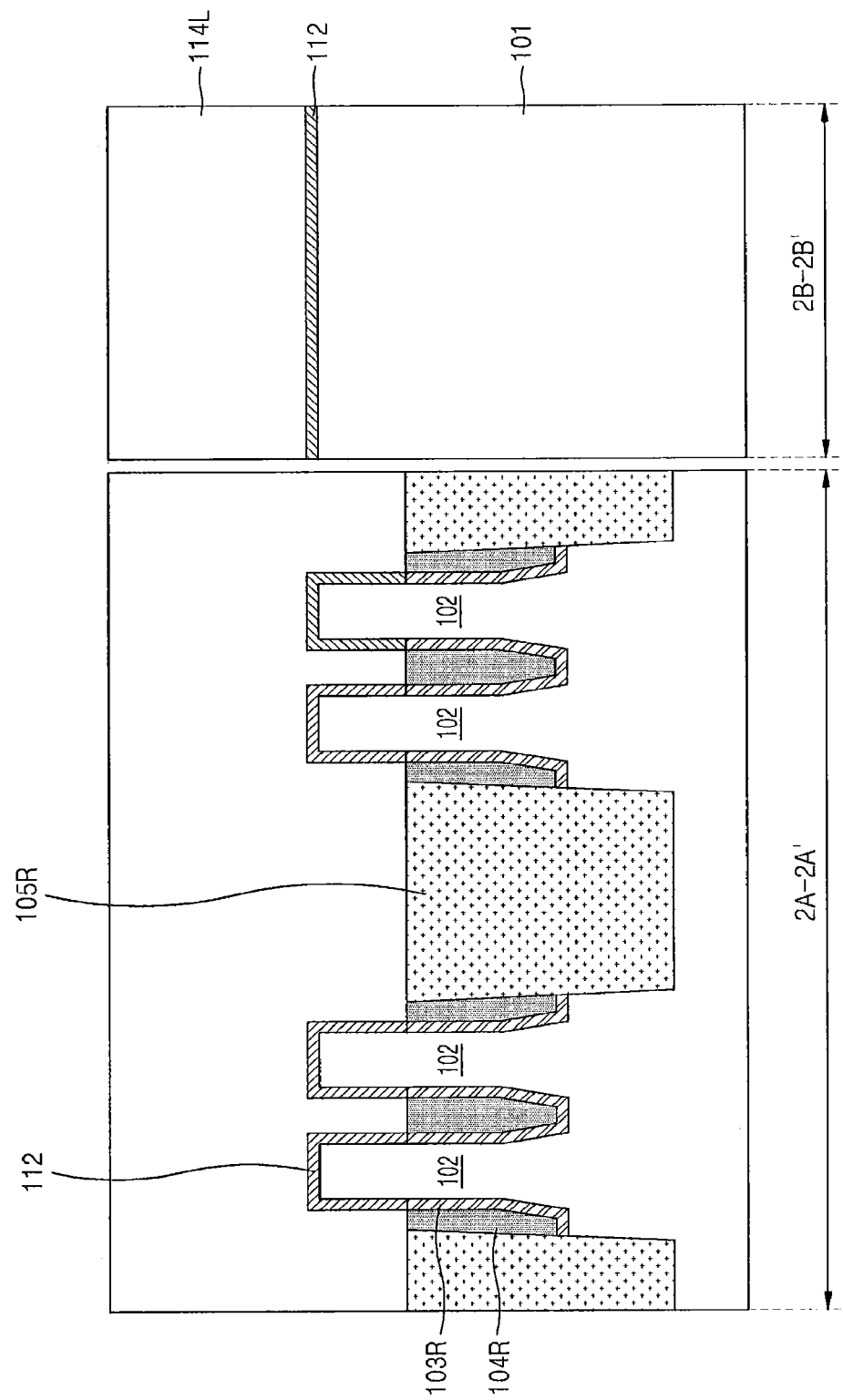
Figure 2P:
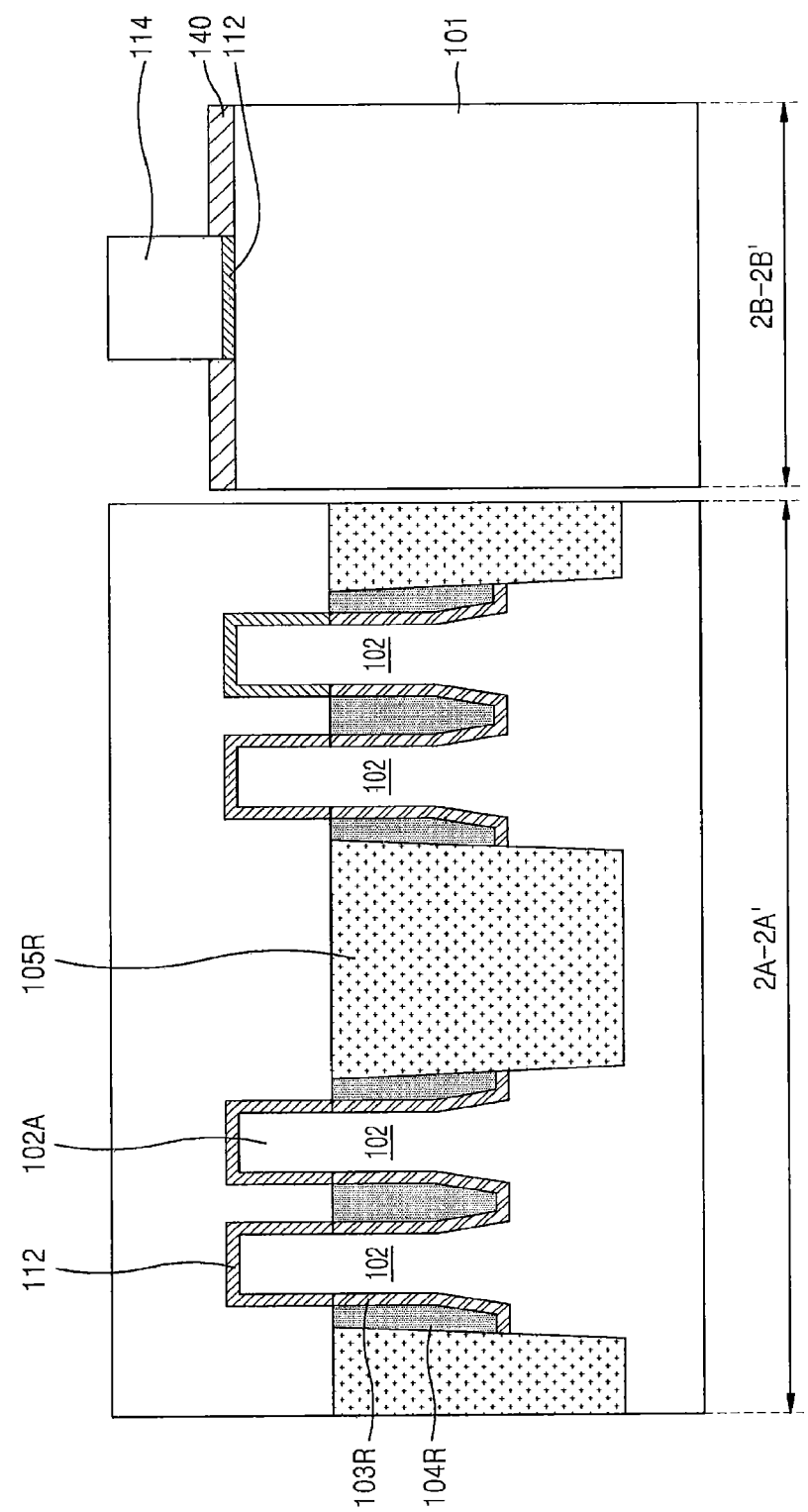

FIGS. 2A to 2P are cross-sectional views illustrating methods of manufacturing a semiconductor device, according to some embodiments of the present inventive concepts. A method of manufacturing the semiconductor device 100 shown in FIGS. 1A and 1B will be described with reference to FIGS. 2A to 2P. In particular, FIGS. 2A to 2P are cross-sectional views taken along line 2A-2A' and line 2B-2B' of FIG. 1A. Like reference numerals refer to like elements through FIGS. 1A to 2P, and accordingly, repeated descriptions thereof are omitted for conciseness.

Referring to FIG. 2A, the substrate 101 is prepared and a first pad insulating layer 122 and a second pad insulating layer 124 are formed on the substrate 101.

In some embodiments, the first pad insulating layer 122 may be formed of an oxide layer. In some embodiments, the second pad insulating layer 124 may be formed of a nitride layer. In some embodiments, the first pad insulating layer 122 and the second pad insulating layer 124 may be formed through a chemical vapor deposition (CVD) process.

The first pad insulating layer 122 and the second pad insulating layer 124 may serve to protect a surface of the substrate 101 during following processes of forming a plurality of fins shown in FIGS. 2B and 2C. In some embodiments, an operation of forming the first pad insulating layer 122 and the second pad insulating layer 124 on the substrate 101 may be omitted.

Referring to FIG. 2B, a plurality of first mask patterns 132P is formed on the second pad insulating layer 124. In some embodiments, the plurality of first mask patterns 132P may be formed by forming a first mask layer (not shown) on the second pad insulating layer 124 and etching the first mask layer by using a photoresist pattern (not shown), which is formed through a photolithography process, as an etching mask.

In some embodiments, the first mask layer may be formed of a carbon-containing layer (hereinafter, referred to as a SOH layer), an oxide layer, and/or a nitride layer. The SOH layer may be formed of a hydrocarbon compound including an aromatic ring, such as phenyl, benzene, or naphthalene and its derivatives. The SOH layer may be formed of an organic compound having a relatively high carbon content of about 85 weight % to about 99 weight % on the basis of the total weight of the SOH layer, and may be formed through a spin coating process.

The plurality of first mask patterns 132P may be repeatedly formed with a first width WA1 at a first pitch P1. In some embodiments, the first width WA1 may have a value that is ½ of the first pitch P1. In some embodiments, the plurality of first mask patterns 132P may be formed of a plurality of line patterns that are repeatedly formed at the first pitch P1 on the second pad insulating layer 124.

Referring to FIG. 2C, by using the plurality of first mask patterns 132P as an etching mask to etch the substrate 101, the first pad insulating layer 122, and the second pad insulating layer 124, a plurality of first device isolating trenches T1 are formed.

The plurality of first device isolating trenches T1 may be repeatedly formed with a second width WA2 at the first pitch P1. As the plurality of first device isolating trenches T1 are formed, a plurality of fins 102 may be repeatedly formed with a first width WA1 corresponding to the plurality of first mask patterns 132P (refer to FIG. 2B) at the first pitch P1.

Referring to FIG. 2D, a preliminary liner insulating layer 103 is formed on the exposed surfaces of the plurality of fins 102, and a first preliminary device isolating layer 104 is formed to cover the preliminary liner insulating layer 103 and also cover the top surface and both sides of the second pad insulating layer 124P, in the plurality of first device isolating trenches T1. Then, by removing a portion of the second pad insulating layer 124P and the first preliminary device isolating layer 104, a top surface of the second pad insulating layer 124P is exposed.

In some embodiments, the preliminary liner insulating layer 103 may be formed of polysilicon, and the first preliminary device isolating layer 104 may be formed of an oxide layer. The preliminary liner insulating layer 103 allows the first preliminary device isolating layer 104 fill between the plurality of first device isolating trenches T1 without defects, such as voids. As predetermined heat is applied simultaneously when or after the first preliminary device isolating layer 104 is formed, the preliminary liner insulating layer 103 may be reformed as an oxide layer. In some embodiments, a portion of the first preliminary device isolating layer 104 and the second pad insulating layer 124 may be removed through a CMP process.

In addition, according to some further embodiments, the forming of the preliminary liner insulating layer 103P is omitted, and the first preliminary device isolating layer 104 is formed to fill between the plurality of first device isolating trenches T1 and cover the second pad insulating layer 124P. Then, the top surface of the second pad insulating layer 124P may be exposed by planarizing the first preliminary device isolating layer 104.

Referring to FIG. 2E, after a portion of the first preliminary device isolating layer 104 is removed to expose a side of the second pad insulating layer 124P, the second pad insulating layer 124P is removed. Then, top surfaces 102T of at least some of the plurality of fins 102 are exposed by removing the first pad insulating layer 122P through a planarization process.

In some embodiments, top surfaces 102T of the plurality of fins 102 may be coplanar with a top surface of the preliminary insulating layer 103 and a top surface of the first preliminary device isolating layer 104, and may be exposed, but the present invention is not limited thereto. In relation to the technical inventive concepts described herein, the top surfaces 102T of the plurality of fins 102 may be exposed at a lower level or higher level than the top surface of the preliminary insulating layer 103 and/or the top surface of the first preliminary device isolating layer 104.

Referring to FIG. 2F, by removing a portion of the preliminary insulating layer 103 and the first preliminary device isolating layer 104, the liner insulating layer 103R and the first device isolating layer 104R are formed and a portion of sides of the plurality of fins 102 are exposed. Accordingly, a fin-type active area 102A that has the top surfaces 102T and both sides 102S of the plurality of fins 102, which protrude upwardly from the liner insulating layer 103R and the first device isolating layer 104R and are exposed, may be defined.

In some embodiments, the liner insulating layer 103R and the first device isolating layer 104R may be removed through a dry etching process using plasma. In some embodiments, a top surface 103RT of the liner insulating layer 103R may be coplanar with a top surface 104RT of the first device isolating layer 104R.

Referring to FIG. 2G, the insulating layer 112 covering the exposed surface of the fin-type active area 102A is formed. In some embodiments, the insulating layer 112 may be formed to conformally cover the top surface 102T and the both sidewalls or sides 102S of the fin-type active area 102A. In some embodiments, the insulating layer 112 may be formed to a predetermined thickness, for example, the same thickness as the liner insulating layer 103R, to cover the top surface 103RT of the liner insulating layer 103R on the both sides 102S of the fin-type active area 102A, but the present inventive concepts are not limited thereto. In some embodiments, the insulating layer 112 may be formed to cover a portion of the top surface 103RT of the liner insulating layer 103R on the both sides 102S of the fin-type active area 102A, and may be formed to cover the top surface 103RT of the liner insulating layer 103R and a portion of the top surface 104RT of the first device isolating layer 104R on the both sides 102S of the fin-type active area 102A.

The insulating layer 112 may simultaneously serve as a gate insulating layer of a FinFET and serve to protect the fin-type active area 102A from damage occurring during a subsequent process. Accordingly, in some embodiments, the insulating layer 112 separates the plurality of fins 102 individually in units of fin-type active area groups FG during subsequent processes, and is formed before the conductive line 114 is formed (refer to FIGS. 2N to 2O). In some embodiments, if the insulating layer 112 is damaged during subsequent processes, after the plurality of fins 102 are separated individually in units of fin-type active area groups FG during subsequent processes, the insulating layer 112 is removed before the conductive line 114 is formed (refer to FIGS. 2N to 2O). Then, a new insulating layer may be formed.

In some embodiments, the insulating layer 112 may be formed of an oxide layer, a nitride layer, or an oxynitride layer. In other embodiments, the insulating layer 112 may be formed of a high-k layer having a higher dielectric constant than a silicon oxide layer. For example, the insulating layer 112 may have a dielectric constant of about 10 to about 25. In some embodiments, the insulating layer 112 may be formed of HfO, HfSiO, HfON, HfSiON, LaO, LaAlO, ZrO, ZrSiO, ZrON, ZrSiON, TaO, TiO, BaSrTiO, BaTiO, SrTiO, YO, AlO, and/or PbScTaO.

Moreover, if the insulating layer 112 serves only to protect the fin-type active area 102A from damage occurring during a subsequent process, it may be replaced with a metallic thin layer. However, in this case, the metallic thin layer will be removed among subsequent processes and then, an insulating layer formed of the above materials will be formed again.

Referring to FIG. 2H, a sacrificial layer 126 is formed to cover the liner insulating layer 103R, the first device isolating layer 104R, and the insulating layer 112. In some embodiments, the sacrificial layer 126 may be formed of a nitride layer. In some embodiments, the sacrificial layer 126 may be formed through an atomic layer deposition (ALD) process. Although the sacrificial layer 126 is formed of a single layer in FIG. 2H, the present invention is not limited thereto. The sacrificial layer 126 may be formed of a multilayer structure including a nitride layer and an oxide layer in some embodiments.

Referring to FIG. 2I, a plurality of second mask patterns 134P are formed on the sacrificial layer 126. In some embodiments, the plurality of second mask patterns 134P may be formed by forming a second mask layer (not shown) on the sacrificial layer 126, and etching the second mask layer by using a photoresist pattern (not shown) formed through a typical photolithography process. The second mask layer may be formed of the above materials used for forming the first mask layer.

The plurality of second mask patterns 134P may be repeatedly formed with a third width WA3 at a second pitch P2. In some embodiments, the third width WA3 may be half of the second pitch P2. In FIG. 2I, although the size of the third width WA3 is illustrates as covering the two entire fins 102 on the sacrificial layer 126, the present invention is not limited thereto. In some embodiments, the size of the third width WA3 may have a value covering at least one entire fin 102 on the sacrificial layer 126. Accordingly, the fin-type active area groups FG including at least one fin 102 may be defined during a subsequent process.

In some embodiments, the second pitch P2 may be greater than the first pitch P1 of the plurality of first mask patterns 132P, and the third width WA3 may be greater than the first width WA1 of the plurality of first mask patterns 132P (refer to FIG. 2B). In some embodiments, the plurality of second mask patterns 134P may have various shapes of patterns on the sacrificial layer 126 according to an individual unit device shape.

Referring to FIG. 2J, the substrate 101, the liner insulating layer 103R, the first device isolating layer 104R, and the sacrificial layer 126 are etched by using the plurality of second mask patterns 134P as an etching mask, so as to form a plurality of second device isolating trenches T2. The plurality of second device isolating trenches T2 may be repeatedly formed with a fourth width WA4 at the second pitch P2. As the plurality of second device isolating trenches T2 are formed, the fin-type active area groups FG formed repeatedly with the third width WA3 of the plurality of second mask patterns 134P (refer to FIG. 2I) at the second pitch P2, each including the fin-type active area 102A of two fins 102, may be defined.

Referring to FIG. 2K, a second preliminary device isolating layer 105 filling the plurality of second device trenches T2 and covering the sacrificial layer 126P is formed and is planarized so that a top surface of the sacrificial layer 126P is exposed from the second preliminary device isolating layer 105. In some embodiments, the second preliminary device isolating layer 105 may be formed of an oxide layer. Although the second preliminary device isolating layer 105 is formed of a single layer structure, as shown in FIG. 2K, the present invention is not limited thereto. The second preliminary device isolating layer 105 may be formed of a multilayer structure including the liner insulating layer (refer to FIG. 2D), which covers the top surface of the substrate 101 and the both sidewalls of the plurality of fins 102 in the plurality of second device isolating trenches T2 and is formed of a thermal oxide layer, and an oxide layer filling between the plurality of second device isolating trenches T2 on the liner insulating layer.

Referring to FIG. 2L, by implanting an impurity to the fin-type active area groups FG from an upper side of the substrate 101 through the sacrificial layer 126P in a vertical direction, the fin-type active areas 102A in the fin-type active area groups FG may be doped with an impurity. The impurity may be p- or n-type conductive ions, and the fin-type active areas 102A in the fin-type active area groups FG may be doped with p- or n-type conductive ions. In some embodiments, p- or n-type wells may be formed in the fin-type active areas 102A of the fin-type active area groups FG through the impurity implantation.

Referring to FIG. 2M, by removing a portion of the second preliminary device isolating layer 105 between the fin-type active area groups FG, a second device isolating layer 105R may be formed. In some embodiments, the second preliminary device isolating layer 105 may be removed through a dry etching process using plasma. In some embodiments, a portion of the second preliminary device isolating layer 105 may be removed to allow the top surface 105RT of the second device isolating layer 105R to be coplanar with the top surface 104RT of the first device isolating layer 104R.

Referring to FIG. 2N, by removing the sacrificial layer 126P, the insulating layer 112 filling in the fin-type active area groups FG and the top surface 104RT of the first device isolating layer 104R are exposed. In some embodiments, if the insulating layer 112 is damaged, after the insulating layer 112 is removed, another insulating layer may be formed on the exposed surface of the fin-type active areas 102A.

In some embodiments, portions not covered by a conductive line 114 (refer to FIGS. 2O and 2P) in the fin-type active areas 102A during a subsequent process are defined as a source/drain area. An impurity may be additionally implanted in the source/drain area.

In this way, even when the plurality of fin-type active areas 102A are divided by units of fin-type active area groups FG according to device characteristics, the top surface 104RT of the first device isolating layer 104R may be formed at the same level in each of the fin-type active groups FG and between the fin-type active area groups FG, and also the top surface 105RT of the second device isolating layer 105R may be formed at the same level as the top surface 104RT of the first device isolating layer 104R.

That is, according to an exemplary manufacturing method of the present invention, the first device isolating trenches T1 for forming the plurality of fins 102 are formed before the second device isolating trenches T2 are formed to divide the fins 102 into individual device units on the substrate 101, and the fin-type active area 102A of each fin 102 is defined.

Therefore, since a thickness difference of a device isolation layer occurring due to different pitches of the trenches during processes of forming the trenches and the device isolating layer, i.e., a pattern loading phenomenon, is reduced or prevented, the fin-type active area 102A of each of the plurality of fins 102 may be uniformly formed. Accordingly, deviations in electrical characteristics in FinFETs on the substrate 101 may be reduced or minimized, and as a result, the performance of a semiconductor device including the FinFETs may be improved.

Referring to FIG. 2O, a conductive layer 114L is formed to cover the insulating layer 112, the first device isolating layer 104R, and the second device isolating layer 105R. In some embodiments, the conductive layer 114L may be formed of polysilicon, polysilicon-germanium alloy, W, Ta, Al, oxide thereof, or nitride thereof. In addition, although the conductive layer 114L is illustrated as being formed of a single layer structure, in FIG. 2O, the present invention is not limited thereto. That is, the conductive layer 114L may be formed of a multilayer structure in some embodiments.

Referring to FIG. 2P, a conductive line 114 is formed to cover the top surface and both sides of each of the plurality of fin-type active areas 102A and extend in a direction intersecting the plurality of fin-type active areas by removing a portion of the conductive layer 114L. Accordingly, a plurality of FinFETs TRs (not shown) may be formed along the conductive line 114, where the conductive line 114 contacts the channel region between the source/drain regions in the fin type active areas 102A.

A portion of the insulating layer 112 not covered by the conductive line 114 on the fin-type active areas 102A is removed and then, the semiconductor layer 140 is formed. The semiconductor layer 140 is identical to one described with reference to FIGS. 1A and 1B. In some embodiments, the semiconductor layer 140 may be formed by recessing a portion of the fin-type active areas 102A, which is exposed by removing a portion of the insulating layer 112, and editorially growing a semiconductor layer. The semiconductor material may include Si, Ge, C, or Sn.

Figure 3B:
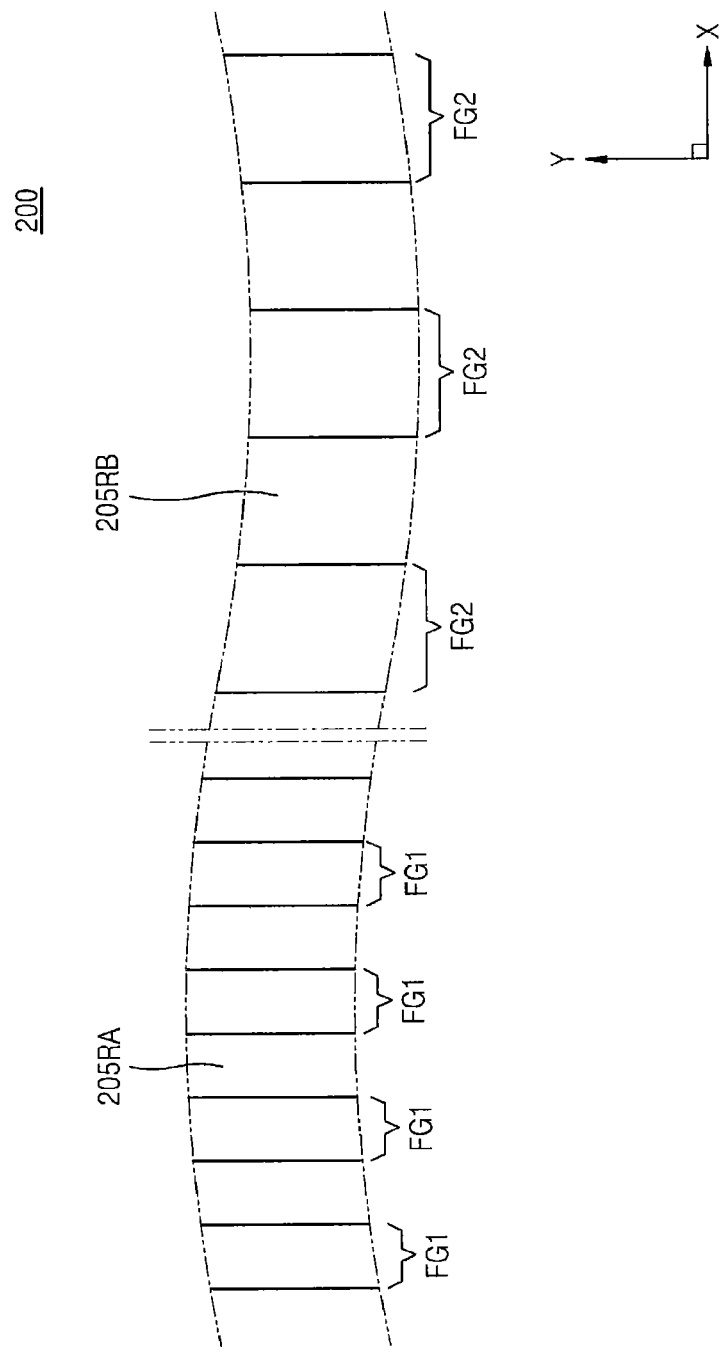

FIGS. 3A and 3B are plan views illustrating a configuration of a semiconductor device 200 according to some other embodiments of the present invention. In describing FIGS. 3A and 3B, like reference numerals corresponding to FIGS. 1A and 1B refer to like elements. For conciseness, their detailed descriptions are omitted, and thus, only differences are mainly described.

Referring to FIGS. 3A and 3B, the plurality of fins 202 may extend in parallel to each other on a substrate along the first direction (the Y direction of FIG. 3), and each may include a fin-type active area 202A. A liner insulating layer and a first device isolating layer 204R may be formed between the plurality of fins 202. The plurality of fins 202 may be separated from each other by the liner insulating layer and the first device isolating layer 204R.

The plurality of fins 202 may be spaced apart from each other by units of first fin-type active area groups FG1 and units of second fin-type area groups FG2, which are repeated at different pitches. That is, the plurality of fins 202 may be grouped in the first fin-type active area groups FG1 including two fin-type active areas and the second fin-type area groups FG2 including four fin-type active areas. Also, a first portion 205RA and a second portion 205RB of the second device isolating layer 205R having different widths in the second direction (the X direction of FIG. 3) may be respectively formed between the first fin-type active area groups FG1 and between the second fin-type active area groups FG2.

Moreover, although the plurality of fins 202 are grouped in the first and second fin-type active area groups FG1 and FG2 as shown in FIGS. 3A and 3B by way of example, embodiments of the present invention are not limited thereto. In some embodiments, the plurality of fins 202 may be grouped in a fin-type active area group including a different number of fin-type active areas than the first and second fin-type active area groups FG1 and FG2.

Furthermore, although some of the plurality of fins 202 are divided in an area by the first fin-type active area group FG1 and some of the plurality of fins 202 are divided in an area by the second fin-type active area group FG2 as shown in FIGS. 3A and 3B, embodiments of the present invention are not limited thereto. In some embodiments, an area where some of the plurality of fins 202 are divided by the first fin-type active area group FG1 and an area where some of the plurality of fins 202 are divided by the second fin-type active area group FG2 may overlap each other. In some embodiments, the plurality of fins 202 may be grouped and separated by one unit in which the first and second fin-type active area groups FG1 and FG2 are adjacent to each other.

A conductive line 214 may extend in the second direction (the X direction of FIGS. 3A and 3B) in which the conductive line 214 intersects the plurality of fins 202, on the first device isolating layer 204R and the second device isolating layer 205R on the substrate. An insulating layer 212 may be formed on the fin-type active area of the plurality of fins 202 in an area where the plurality of fins 202 and the conductive line 214 overlap, and as a result, a plurality of FinFETs may be formed along the conductive line 214. In particular, source/drain regions or areas may be formed on the fin-type active area of the plurality of fins 202 in areas where the plurality of fins 202 and the conductive line 214 do not overlap, and a semiconductor layer 240 may be formed on the source/drain areas.

FIGS. 4A to 4H are cross-sectional views illustrating methods of manufacturing a semiconductor memory device, according to some embodiments of the present invention. An example method of manufacturing the semiconductor device 200 of FIG. 3A will be described with reference to FIGS. 4A to 4H. In particular, FIGS. 4A to 4H respectively illustrate portions taken along lines 4A-4A', 4B-4B', and 4C-4C' of FIG. 3A. In describing FIGS. 4A and 4H, like reference numerals corresponding to FIGS. 2A and 2P refer to like elements. For conciseness, detailed descriptions thereof are omitted, and thus, only differences are mainly described.

Referring to FIG. 4A, after a substrate 201 is etched by using a plurality of mask patterns having a first width WA1 and repeating at a first pitch P1 as shown in FIGS. 2A to 2E, a plurality of fins 202 having the first width WA1 and repeating at the first pitch P1 are formed. Also, a preliminary liner insulating layer and a first preliminary device isolating layer are formed between the plurality of fins 202. Then, by removing a portion of the preliminary liner insulating layer and the first preliminary device isolating layer, the liner insulating layer 203R and the first device isolating layer 204R are formed and a portion of the sides of the plurality of fins 202 are exposed. Accordingly, a fin-type active area 202A is defined in each of the plurality of fins. The fin-type active area 202A includes top surfaces 202T and both sides/sidewalls 202S of the plurality of fins 202, which are exposed and protrude upwardly from the liner insulating layer 203R and the first device isolating layer 204R. In some embodiments, a top surface 203RT of the liner insulating layer 203R may be coplanar with a top surface 204RT of the first device isolating layer 204R.

Figure 4B:
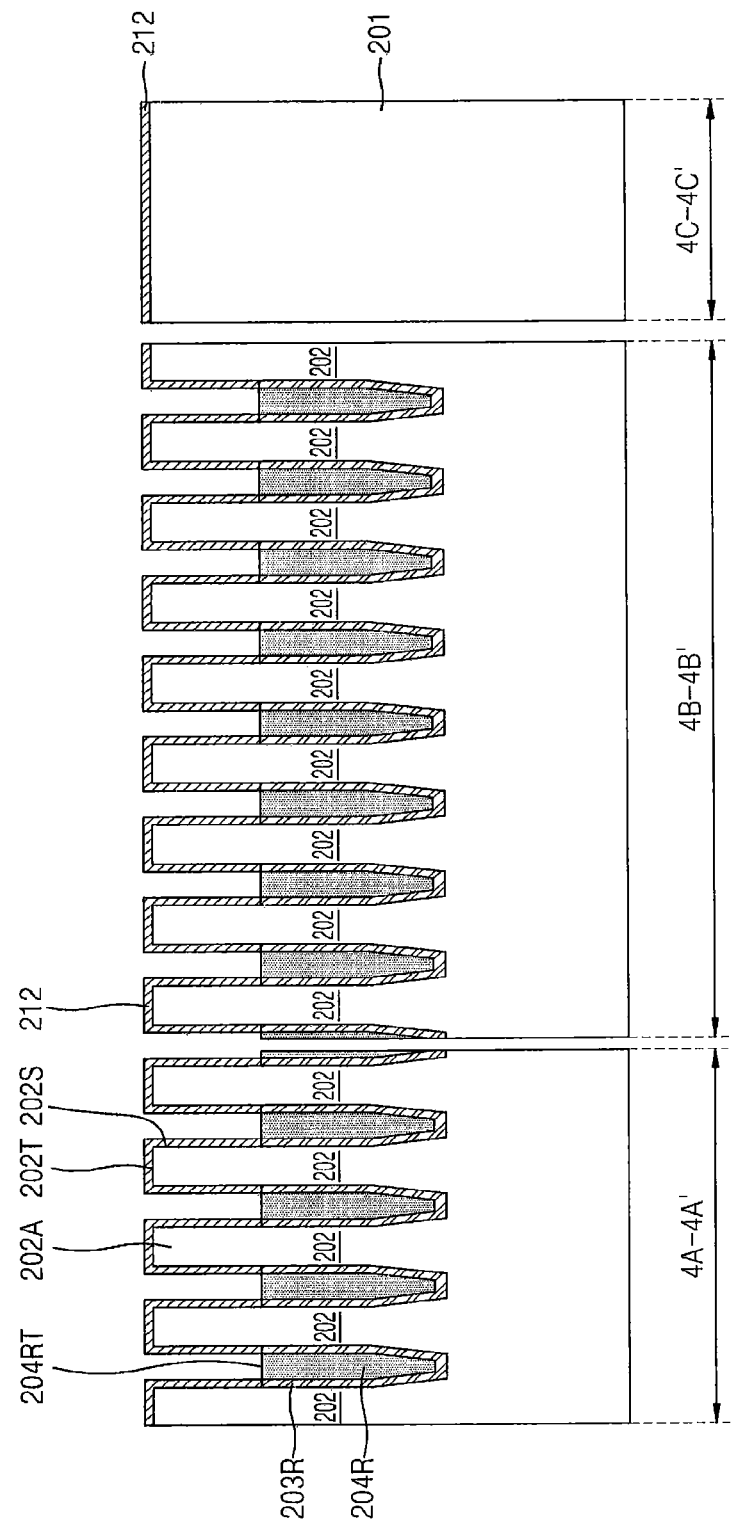

Referring to FIG. 4B, an insulating layer 212 on or covering the exposed surface of the fin-type active area 202A is formed. In some embodiments, the insulating layer 212 may be formed to conformally cover the top surface 202T and the both sides 202S of the fin-type active area 202A. In some embodiments, the insulating layer 212 may be formed at a predetermined thickness, for example, the same thickness as the liner insulating layer 203R, to cover the top surface 203RT of the liner insulating layer 203R on both sides 202S of the fin-type active area 202A, but embodiments of the present inventive concepts are not limited thereto.

Figure 4C:
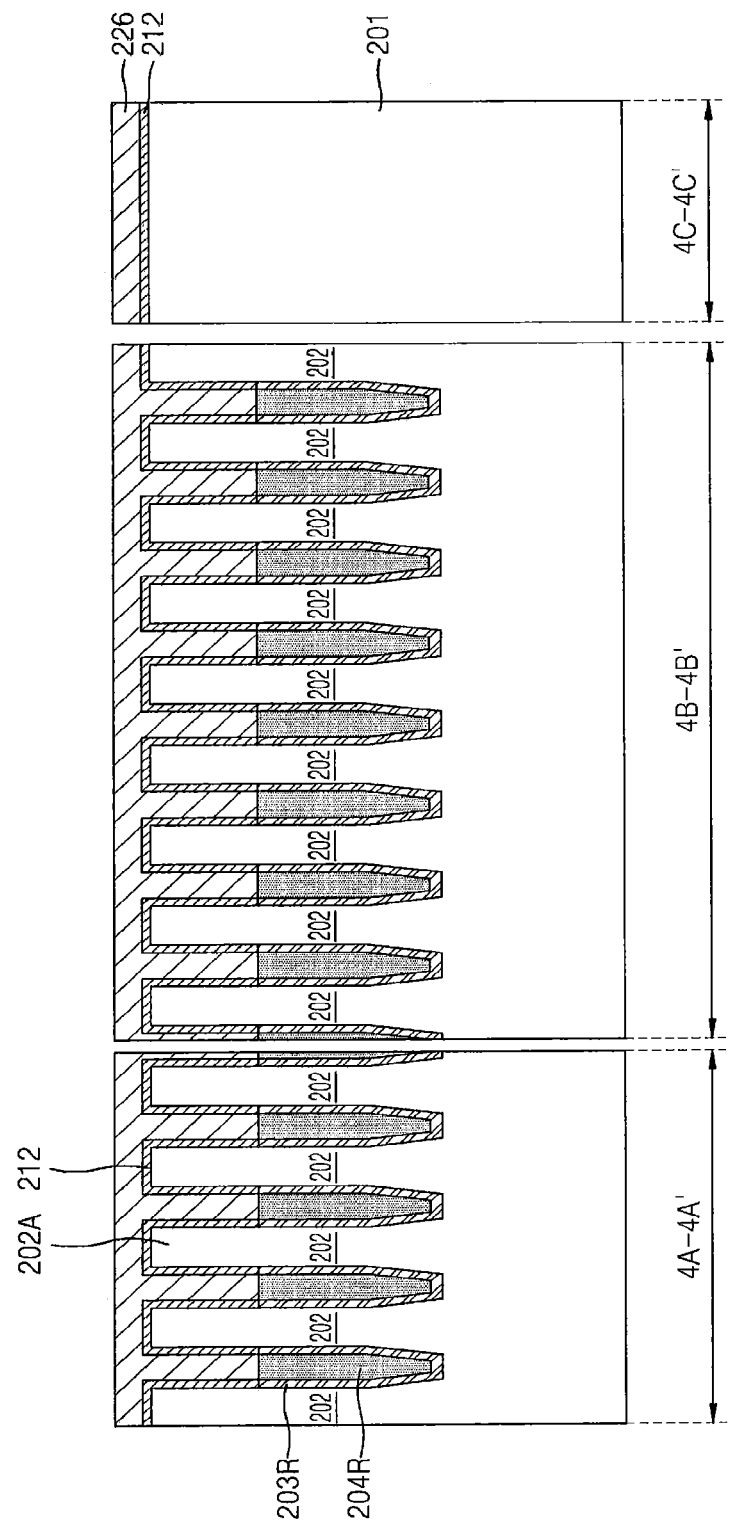
Figure 4D:
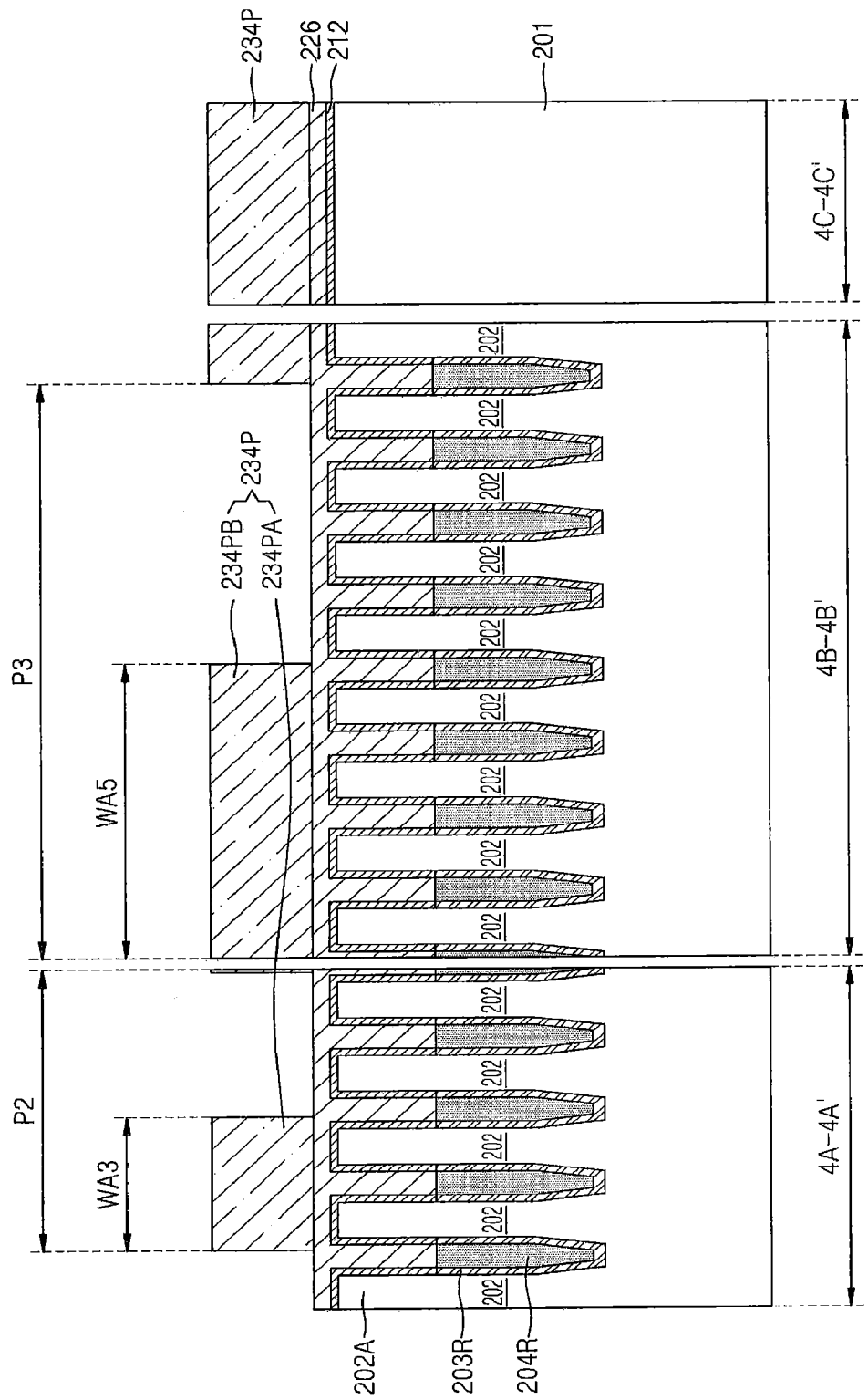
Figure 4E:
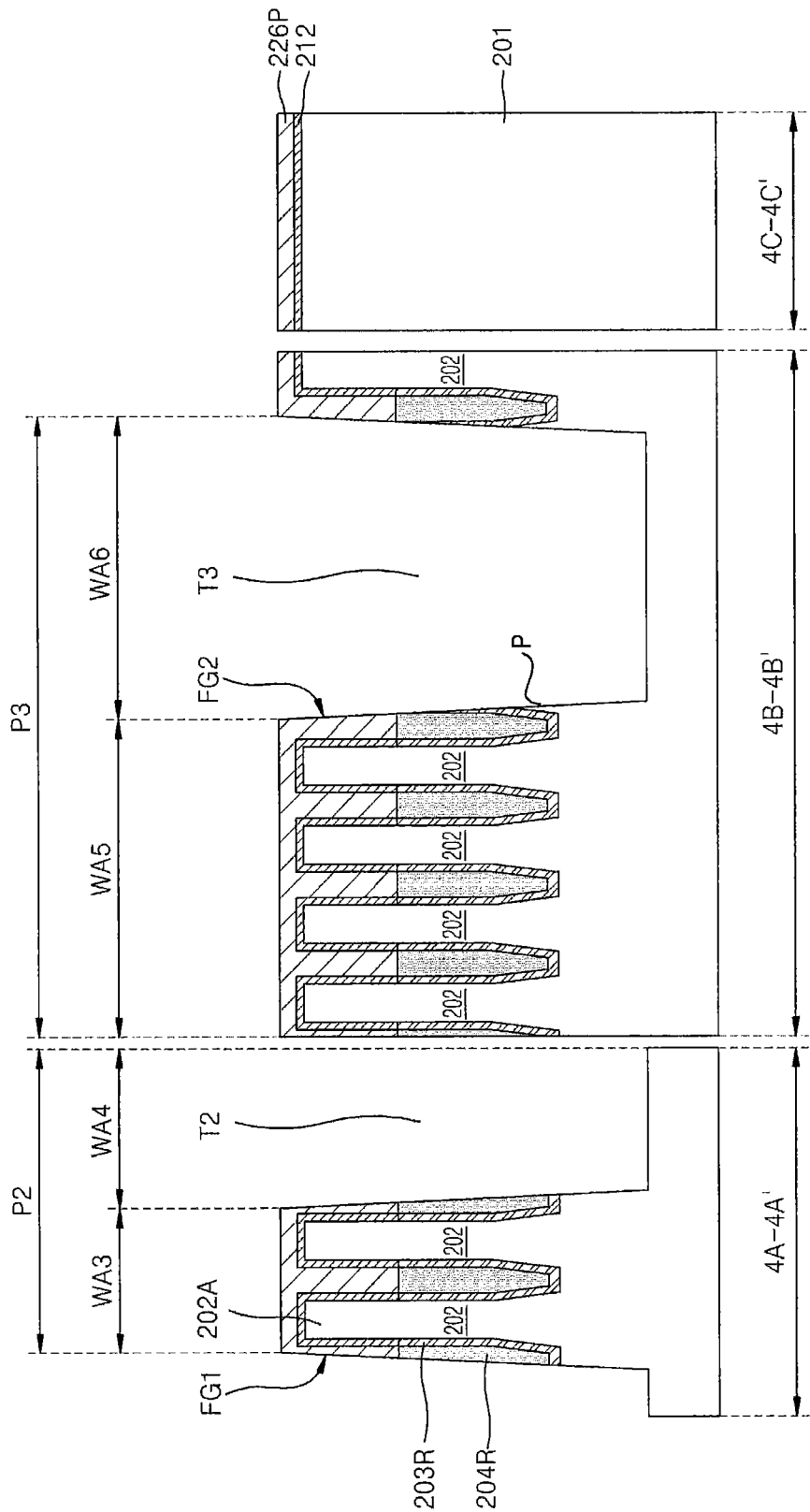
Figure 4F:
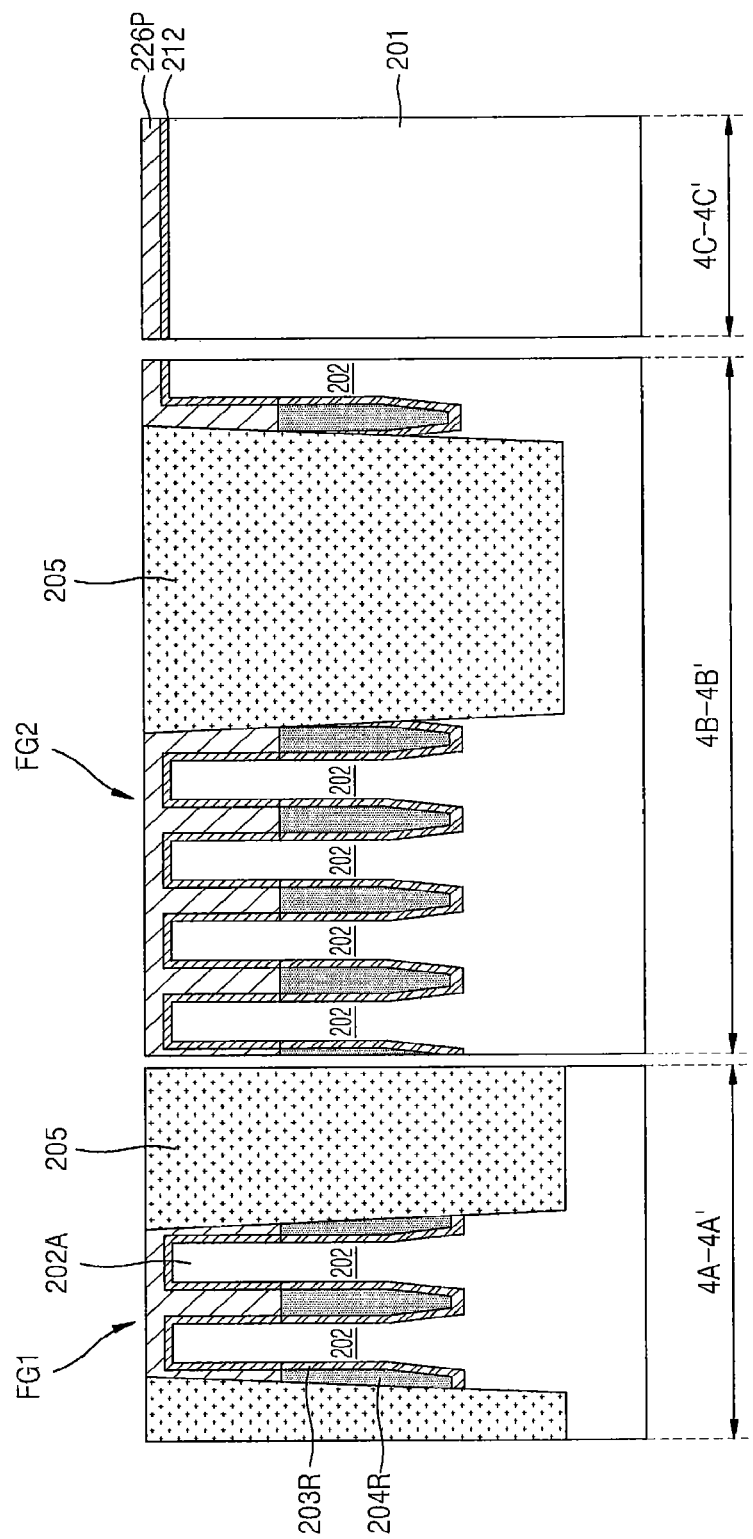
Figure 4H:
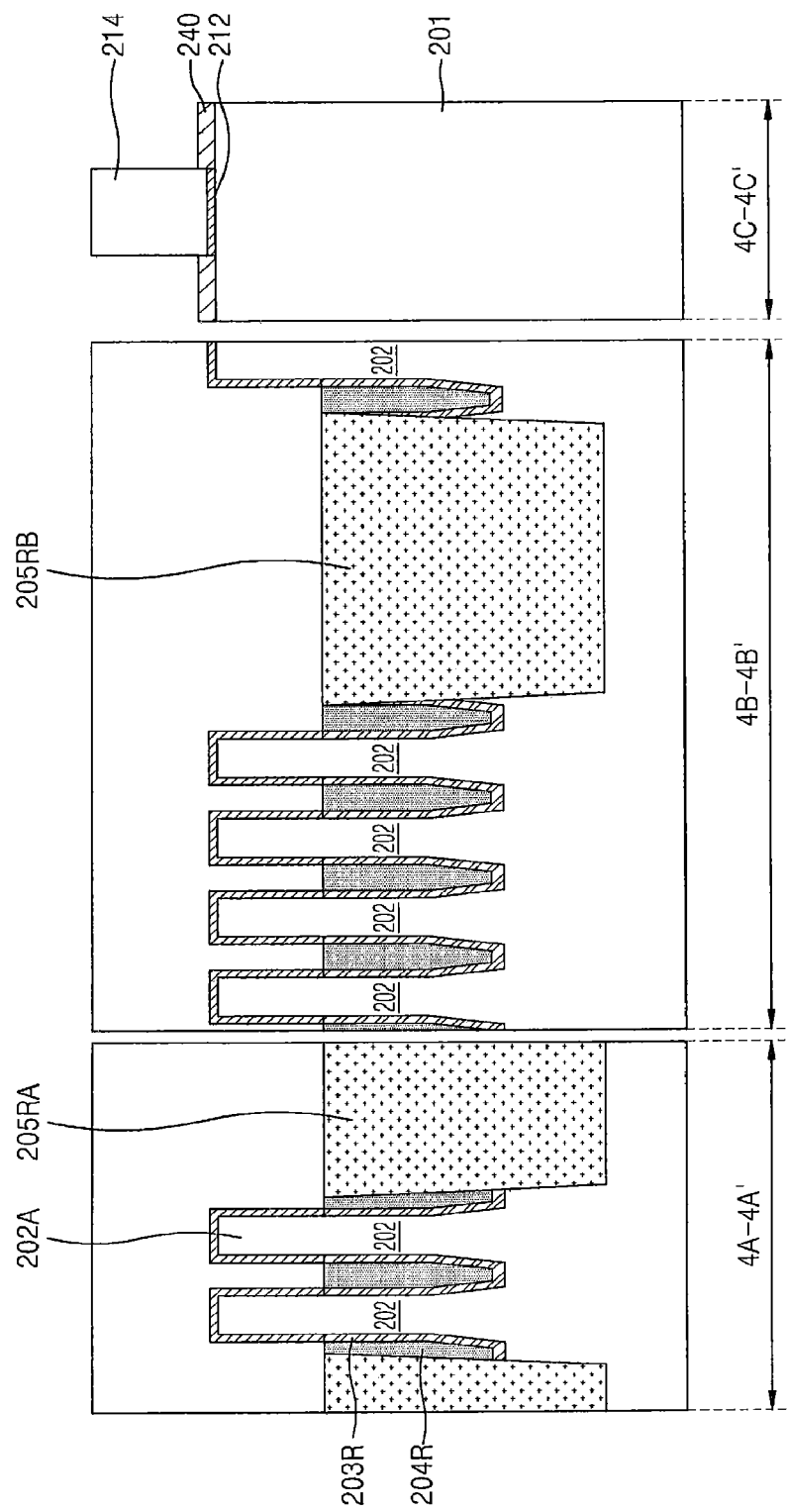

In some embodiments, if the plurality of fins 202 are separated individually by units of the first and second fin-type active area groups FG1 and FG2 during subsequent processes, the insulating layer 212 may be formed before a conductive line 214 is formed (refer to FIGS. 4G and 4H). If the insulating layer 212 is damaged, it may be reformed before the conductive line 214 is formed (refer to FIG. 4H). Moreover, if the insulating layer 212 serves to protect the fin-type active area 202A from damage occurring during a subsequent process, it may be replaced with a metallic thin layer.

Referring to FIG. 4C, a sacrificial layer 226 is formed to cover the liner insulating layer 203R, the first device isolating layer 204R, and the insulating layer 212.

Referring to FIG. 4D, a plurality of second mask patterns 234P are formed on the sacrificial layer 226. The plurality of second mask patterns 234P may include a first portion 234PA repeated with a third width WA3 at a second pitch P2 and a second portion 234PB repeated with a fifth width WA5 at a third pitch P3. In some embodiments, the third width WA3 may be half of the second pitch P2, and the fifth width WA5 may be half of the third pitch P3.

In some embodiments, the second pitch P2 and the third pitch P3 may be greater than the first pitch P1 of the plurality of first mask patterns 132p for forming the plurality of fins 202, and the third width WA3 and the fifth width WA5 may be greater than the first width WA1 of the first mask pattern 132p. The third pitch P3 may be greater than the second pitch P2, and the fifth width WA5 may be greater than the third width WA3.

Referring to FIG. 4E, the substrate 201, the liner insulating layer 203R, the first device isolating layer 204R, and the sacrificial layer 226 are etched by using the plurality of second mask patterns 234P as an etching mask, so as to form a plurality of second device isolating trenches T2 and a plurality of third device isolating trenches T3.

The plurality of second device isolating trenches T2 may be repeatedly formed with a fourth width WA4 at the second pitch P2. As the plurality of second device isolating trenches T2 are formed, the first fin-type active area groups FG1 formed repeatedly with the third width WA3 of the first portion 234PA of the plurality of second mask patterns 234P at the second pitch P2, each including the fin-type active area 202A of two fins 202, may be defined.

The plurality of third device isolating trenches T3 may be repeatedly formed with a sixth width WA6 at the third pitch P3. As the plurality of third device isolating trenches T3 are formed, the second fin-type active area groups FG2 formed repeatedly with the fifth width WA5 of the second portion 234PB of the plurality of second mask patterns 234P at the third pitch P3, each including the fin-type active area 202A of four fins 202 and portion P, may be defined.

Referring to FIG. 4F, a second preliminary device isolating layer 205 filling the plurality of second device trenches T2 and the plurality of third device isolating trenches T3 and covering the sacrificial layer 226P is formed and is planarized, so that a top surface of the sacrificial layer 226P is exposed from the second preliminary device isolating layer 205.

Referring to FIG. 4G, by removing a portion of the second preliminary device isolating layer 205 between the first fin-type active area groups FG1, a first portion 205RA of the a second device isolating layer 205R may be formed. By removing a portion of the second preliminary device isolating layer 205 between the second fin-type active area groups FG2, a second portion 205RB of the second device isolating layer 205R may be formed. A top surface 204RAT of a first portion 205RA and a top surface 205RBT of the second portion 205RB may be coplanar with a top surface of the first device isolating layer 204R.

In such a way, even when the plurality of fins 202 are separated by units of the first and second fin-type active area groups FG1 and FG2 having different pitch sizes according to required device characteristics, the plurality of fin-type active areas 202A may be uniformly formed. That is, according to manufacturing methods of the present inventive concepts, the first device isolating trenches T1 for forming the plurality of fins 202 are formed before the second and third device isolating trenches T2 and T3 are formed to divide the fins 202 into individual device units repeated at different pitches on the substrate 202, and the fin-type active area 202A of each of the fins 202 is defined. Therefore, despite a pattern loading phenomenon that may occur due to different pitches of trenches during processes of forming the trenches and the device isolating layer, the fin-type active area 202A of each of the plurality of fins 202 may be uniformly formed. Accordingly, deviations in electrical characteristics in FinFETs on the substrate 201 may be reduced or minimized, and as a result, the performance of semiconductor devices including the FinFETs may be improved.

Moreover, before the first portion 205RA and the second portion 205RB of the second device isolating layer 205R are formed, impurities are implanted on the first and second fin-type active area groups TG1 and TF2 through the sacrificial layer 226P on the substrate 201, and thus, the fin-type active areas 202A in the first and second fin-type active area groups FG1 and FG2 may be doped with an impurity.

Referring to FIG. 4H, a conductive line 214 is formed to cover at least a portion of the insulating layer 212, the first device isolating layer 204R, and the second device isolating layer 205R. Accordingly, a plurality of FinFETs TRs may be formed along the conductive line 214. A portion of the insulating layer 212 not covered by the conductive line 214 on the fin-type active areas 202A is removed and then, the semiconductor layer 240 is formed. In some embodiments, the semiconductor layer 240 may be formed by recessing a portion of the fin-type active areas 202A, which is exposed by removing a portion of the insulating layer 212, and epitaxially growing a semiconductor layer. The semiconductor material may include Si, Ge, C, or Sn.

Figure 5:
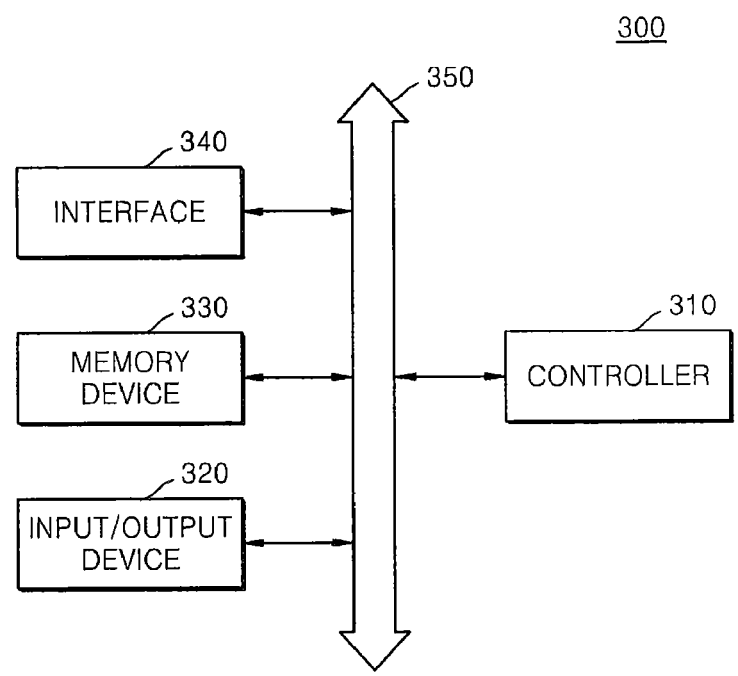
FIG. 5 is a view illustrating a system including semiconductor devices, according to some embodiments of the present inventive concepts.

FIG. 5 is a view illustrating a system 300 including semiconductor devices according to some embodiments of the present inventive concepts. The system 300 may include a controller 310, an input/output device 320, a memory device 330, and an interface 340. The system 300 may be a mobile system, and/or a system for transmitting/receiving information. In some embodiments, the mobile system may include a PDA, a portable computer, a web tablet, a wireless phone, a mobile phone, a digital music player, and/or a memory card. The controller 310 may include a microprocessor, a digital signal processor, a micro controller, or a device similar thereto. The input/output device 320 may input or output data of the system 300. The system 300 may be connected to an external device, such as a personal computer or a network, by using the input/output device 320 so as to exchange data with the external device. The input/output device 320 may include a keypad, a keyboard, and/or a display.

The memory device 330 may store code and/or data for one or more operations of the controller 310, and/or may store data processed by the controller 310. The memory device 330 may include semiconductor devices according to some embodiments of the present inventive concepts. For example, the memory device 330 may include the semiconductor device 100 and/or 200 shown in FIGS. 1A and 1B and/or 3A and 3B.

The interface 340 may be a data transmission path between the system 300 and another external device. The controller 310, the input/output device 320, the memory device 330, and the interface 340 may communicate with each other via a bus 350. The system 300 may be used for a mobile phone, an MP3 player, a navigation system, a portable multimedia player (PMP), a solid state disk (SSD), and/or household appliances.

Figure 6:
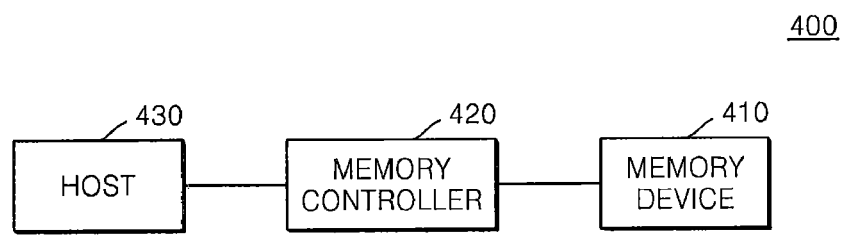
FIG. 6 is a view of a memory card fabricated in accordance with methods of manufacturing a semiconductor device, according to some embodiments of the present inventive concepts.

FIG. 6 is a view of a memory card 400 realized or through or otherwise implemented using methods of manufacturing a semiconductor device according to some embodiments of the present inventive concepts. The memory card 400 may include a memory device 410 and a memory controller 420. The memory device 410 may store data. In some embodiments, the memory device 410 has nonvolatile characteristics that retain data even when no power is supplied. The memory device 410 may include a semiconductor device having a FinFET according to some embodiments of the present inventive concepts. For example, the memory device 410 may include the semiconductor device 100 and/or 200 shown in FIGS. 1A and 1B and/or 3A and 3B. The memory controller 420 may read data stored in the memory device 410 or store data in the memory device 410 in response to a read/write request of a host 430.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
   a pair of fin-type active areas protruding from a substrate and being spaced apart from each other with an isolating trench in the substrate interposed between the pair of fin-type active areas; and
   an isolating layer filling the isolating trench,
   wherein the substrate has a pointed portion at a surface of the isolating trench, the pointed portion protruding toward the isolating layer, and
   wherein the pointed portion includes both sidewalls extending from an apex of the pointed portion, the both sidewalls being asymmetric.

2. The semiconductor device of claim 1, wherein the pointed portion is spaced apart from the pair of fin-type active areas.

3. The semiconductor device of claim 1, wherein the pointed portion is located closer to one of the pair of fin-type active areas between the pair of fin-type active areas.

4. The semiconductor device of claim 1, wherein the isolating trench includes a first trench portion having a first bottom level, and a second trench portion communicating with the first trench portion and having a second bottom level deeper than the first bottom level, and wherein at least a part of the pointed portion forms a surface of the second trench portion.

5. The semiconductor device of claim 1, wherein the isolating trench includes a pair of first trench portions and a second trench portion communicating with the pair of first trench portions between the pair of first trench portions, wherein a first vertical distance from a top surface of a selected one of the pair fin-type active areas to a first bottom surface of one of pair of first trench portions is smaller than a second vertical distance from the top surface of the selected one of the pair fin-type active areas to a second bottom surface of the second trench portion, and wherein at least a part of the pointed portion forms a surface of the second trench portion.

6. The semiconductor device of claim 5, wherein a level of a highest point of the pointed portion is higher than the second bottom surface of the second trench portion and lower than the top surface of the selected one of the pair fin-type active areas.

7. The semiconductor device of claim 1, wherein the isolating trench includes a first trench portion having a first bottom level, and a second trench portion communicating with the first trench portion and having a second bottom level deeper than the first bottom level, and wherein the isolating layer includes a first isolating portion filling the first trench portion and a second isolating portion filling the second trench portion, the second isolating portion having a surface contacting at least a part of the pointed portion.

8. The semiconductor device of claim 7, wherein a top surface of the first isolating portion is coplanar with a top surface of the second isolating portion.

9. A semiconductor device comprising:

a pair of fin-type active area groups each having a plurality of fin-type active areas protruding from a substrate and being spaced apart from each other;

a pointed portion protruding from the substrate between the pair of fin-type active area groups; and an isolating layer covering the pointed portion between the pair of fin-type active area groups, the isolating layer including a pair of first isolating portions and a second isolating portion between the pair of first isolating portions, the second isolating portion having a bottom surface deeper than bottom surfaces of the pair of first isolating portions and covering at least a part of the pointed portion, wherein the pointed portion includes both sidewalls extending from an apex of the pointed portion, the both sidewalls being asymmetric.

10. The semiconductor device of claim 9, wherein the pointed portion is spaced apart from the pair of fin-type active area groups.

11. The semiconductor device of claim 9, wherein the pointed portion is located closer to one of the pair of fin-type active area groups.

12. The semiconductor device of claim 9, wherein a level of a highest point of the pointed portion is higher than a bottom surface of the second isolating portion and lower than top surfaces of the plurality of fin-type active areas.

13. The semiconductor device of claim 9, wherein top surfaces of the pair of first isolating portions are coplanar with a top surface of the second isolating portion.

14. The semiconductor device of claim 1, wherein the pointed portion includes an acute angle portion defined by the both sidewalls.

15. The semiconductor device of claim 1, wherein the pair of fin-type active areas protrude from the substrate in a vertical direction, and wherein each of the both sidewalls includes a sidewall portion inclined in a direction crossing the vertical direction.

16. The semiconductor device of claim 9, wherein a peak of the pointed portion is higher than the bottom surfaces of the pair of first isolating portions relative to the substrate.

17. The semiconductor device of claim 9, wherein the plurality of fin-type active areas protrude from the substrate in a vertical direction, and wherein each of the both sidewalls includes a sidewall portion inclined in a direction crossing the vertical direction.

18. A semiconductor device comprising:

a pair of fin-type active areas protruding from a substrate and being spaced apart from each other with an isolating trench in the substrate interposed between the pair of fin-type active areas; and an isolating layer filling the isolating trench, wherein the substrate has a pointed portion at a surface of the isolating trench, the pointed portion having a width that gradually decreases along a direction away from the substrate.

19. The semiconductor device of claim 18, wherein the pointed portion includes both sidewalls extending from an apex of the pointed portion, the both sidewalls being asymmetric.

20. The semiconductor device of claim 19, wherein the pair of fin-type active areas protrude from the substrate in a vertical direction, and wherein each of the both sidewalls includes a sidewall portion inclined in a direction crossing the vertical direction.

* * * * *